United States Patent
Samavedam et al.

(10) Patent No.: US 8,219,049 B2
(45) Date of Patent: Jul. 10, 2012

(54) GENERATING A PROCESS AND TEMPERATURE TRACKING BIAS VOLTAGE

(75) Inventors: Anil Samavedam, Austin, TX (US); David E. Bockelman, Dripping Springs, TX (US); Vishnu Srinivasan, Austin, TX (US)

(73) Assignee: Javelin Semiconductor, Inc., Austin, TX (US)

( * ) Notice: Subject to any disclaimer, the term of this patent is extended or adjusted under 35 U.S.C. 154(b) by 394 days.

(21) Appl. No.: 12/578,838

(22) Filed: Oct. 14, 2009

(65) Prior Publication Data
US 2010/0085119 A1 Apr. 8, 2010

Related U.S. Application Data

(63) Continuation-in-part of application No. 12/080,066, filed on Mar. 31, 2008.

(51) Int. Cl.
*H04B 1/04* (2006.01)
*H03G 3/20* (2006.01)

(52) U.S. Cl. ............................ 455/127.1; 330/130

(58) Field of Classification Search ............... 455/114.2, 455/114.3, 296, 323, 334, 341, 127.1; 330/127, 330/130, 134, 136
See application file for complete search history.

(56) References Cited

U.S. PATENT DOCUMENTS

| | | | |
|---|---|---|---|
| 5,424,680 A | 6/1995 | Nazarathy et al. | |
| 5,495,166 A | 2/1996 | Alini et al. | |
| 5,559,471 A * | 9/1996 | Black | 330/277 |
| 6,055,278 A | 4/2000 | Ho et al. | |
| 6,566,948 B1 | 5/2003 | Braithwaite et al. | |
| 6,570,430 B1 | 5/2003 | Zhou | |
| 6,724,253 B2 | 4/2004 | Hau et al. | |
| 6,774,719 B1 | 8/2004 | Wessel et al. | |
| 6,809,587 B2 | 10/2004 | Ghannouchi et al. | |
| 6,828,858 B2 | 12/2004 | Larson et al. | |
| 6,885,239 B2 | 4/2005 | Otaka | |
| 7,202,736 B1 | 4/2007 | Dow et al. | |
| 7,332,961 B2 | 2/2008 | Blednov | |
| 7,385,447 B1 | 6/2008 | Adar | |
| 7,425,871 B2 | 9/2008 | Gao et al. | |
| 7,729,672 B2 * | 6/2010 | Deng et al. | 455/127.1 |
| 2006/0267689 A1 | 11/2006 | Elmala et al. | |
| 2007/0049215 A1 * | 3/2007 | Chen et al. | 455/86 |
| 2007/0066250 A1 * | 3/2007 | Takahashi et al. | 455/127.1 |
| 2008/0031382 A1 | 2/2008 | Aoki | |
| 2011/0025422 A1 * | 2/2011 | Marra et al. | 330/296 |

OTHER PUBLICATIONS

International Search Report of PCT/US2009/036473, dated Sep. 28, 2009.
International Search Report and Written Opinion of PCT/US2009/036465, dated Sep. 22, 2009.
Chengzhou Wang, et al., "A Nonlinear Capacitance Technique and its Application to a CMOS Class AB Power Amplifier," 2001, pp. 1-4.
U.S. Patent and Trademark Office, Non-Final Office Action dated May 27, 2010 issued in U.S. Appl. No. 12/082,311; along with a Reply to Office Action filed via EFS on Aug. 24, 2010.
Korean Patent and Trademark Office, Office Action mailed Sep. 28, 2011 in Korean application No. 10-2010-7024421.

* cited by examiner

*Primary Examiner* — Blane J Jackson
(74) *Attorney, Agent, or Firm* — Trop, Pruner & Hu, P.C.

(57) ABSTRACT

In one embodiment, a method includes generating a current that is proportional to a mobility and an oxide capacitance of a tracking device and independent of a threshold voltage variation of the tracking device, generating a voltage from the current, and providing the voltage as at least part of a bias voltage for another device. In one embodiment, this other device may be a compensation circuit coupled to a main device to compensate for capacitance non-linearity of the main device.

16 Claims, 18 Drawing Sheets

GENERATING A PROCESS AND TEMPERATURE TRACKING BIAS VOLTAGE

This application is a continuation-in-part of U.S. patent application Ser. No. 12/080,066 entitled "COMPENSATION FOR NON-LINEAR CAPACITANCE EFFECTS IN A POWER AMPLIFIER," filed on Mar. 31, 2008.

BACKGROUND

In various circuitry, amplifiers are commonly used to boost an amplitude of an incoming signal to a desired level. For example, various amplifiers may be present in a given system to boost signal strength of incoming signals to provide them at a desired level for further processing.

In wireless systems such as cellular handsets, mobile internet devices, wireless personal digital systems (PDAs) and so forth, typically a power amplifier (PA) is present to receive a radio frequency (RF) signal modulated as desired for a given communication protocol and amplify this signal for transmission via an antenna of the device. Typically, a power amplifier can amplify both current and voltage of an incoming signal to provide the signal at a desired level.

Different requirements may exist in different communication protocols. Many communication systems have various requirements for a handset to achieve with relation to power, efficiency, and linearity over varying signal levels. For example, a variety of communication systems, including enhanced data rates for GSM evolution (EDGE), long term evolution (LTE/4G), WiFi in accordance with an IEEE 802.11 standard, worldwide interoperability for microwave access (WiMax), code division multiple access (CDMA), and wideband-code division multiple access (W-CDMA) all have modulation schemes that require a linear signal path.

In an amplifier stage of such a PA, if a phase shift through the stage is a function of the amplitude of the input signal, then that amplifier has phase distortion (a.k.a. amplitude modulation-to-phase modulation (AM-to-PM) distortion). AM-to-PM distortion is a non-linear process which degrades the amplifier's overall linearity. AM-to-PM distortion can exist with or without amplitude (a.k.a. AM-to-AM) distortion. Together the two non-linear processes characterize the non-linear behavior that is relevant in ideally linear communications circuits. These non-linear processes cause spectral splatter or leakage of signal energy from a desired channel to nearby channels. In many systems, this spectral splatter is measured by the adjacent channel power ratio (ACPR) or the adjacent channel leakage ratio (ACLR).

Current PAs are typically formed using a gallium arsenide (GaAs) process with bipolar devices that do not suffer significant AM-to-PM distortion. However, in the case of highly efficient complementary metal oxide semiconductor (CMOS) power amplifiers, AM-to-PM distortion can cause a significant linearity problem. AM-to-AM linearization techniques exist for CMOS devices, but such techniques either do not address AM-to-PM distortion, or they are rendered less effective because of AM-to-PM distortion. As a result, an amplifier such as a power amplifier that is formed using CMOS devices can have linearity issues. Alternatively, the CMOS power amplifier can be made to operate in a different mode (a.k.a. Class A) that improves the overall linearity but reduces the efficiency.

SUMMARY OF THE INVENTION

According to one aspect, the present invention is directed to an apparatus that can provide a bias voltage to a compensation device. This bias voltage may vary over process and temperature such that the compensation circuit provides capacitance compensation to a main device to which it is coupled. The apparatus may include a tracking device biased by a first bias voltage, a comparator having a first input coupled to a first terminal of the tracking device to receive a first voltage and a second input to receive a second bias voltage, and a current mirror coupled to the tracking device and gated by the comparator output to output a current. This current is proportional to a mobility and oxide thickness of the tracking device, yet independent of a threshold voltage of the tracking device. A voltage can be generated from this current and provided as at least part of the bias voltage to the compensation device. The tracking device can be formed of at least one unit device having a given aspect ratio, where the main device is formed of multiple unit devices having the same aspect ratio.

Another aspect of the present invention is directed to a method for generating a current that is proportional to a mobility and an oxide capacitance of a tracking device (and independent of a variation of a threshold voltage of the tracking device), generating a voltage from the current in a voltage generation circuit, and providing the voltage as at least part of a bias voltage for another device. In one embodiment, this device may be a compensation circuit coupled to a main device to compensate for capacitance non-linearity of the main device. Where the tracking device has the same aspect ratio as the main device, the generated voltage may be the same as the threshold voltage of the main device.

Yet another aspect of the present invention is directed to a voltage combiner that combines multiple threshold voltages each generated by a different tracking circuit. The combined voltage can be used to bias a compensation device coupled to a gain stage device to compensate for a capacitance non-linearity of the gain stage device.

Another aspect of the present invention is directed to a power amplifier that includes a gain stage and multiple compensation stages. The gain stage may include a pair of complementary amplifiers to receive a differential input signal and to output a differential amplified signal. In turn, each compensation stage has first and second compensation devices each coupled to an amplifier of one of the complementary amplifiers. In this way, each compensation device can compensate for a change in capacitance of the corresponding amplifier when the differential input signal is in a predetermined transition region of an input range. In turn, the compensation device can provide a bias voltage from the voltage combiner. Such a power amplifier may be implemented in a wireless system to amplify signals provided by a transceiver or other such circuitry to an appropriate level for transmission via an antenna or other radiation means.

DETAILED DESCRIPTION

Figure 1:
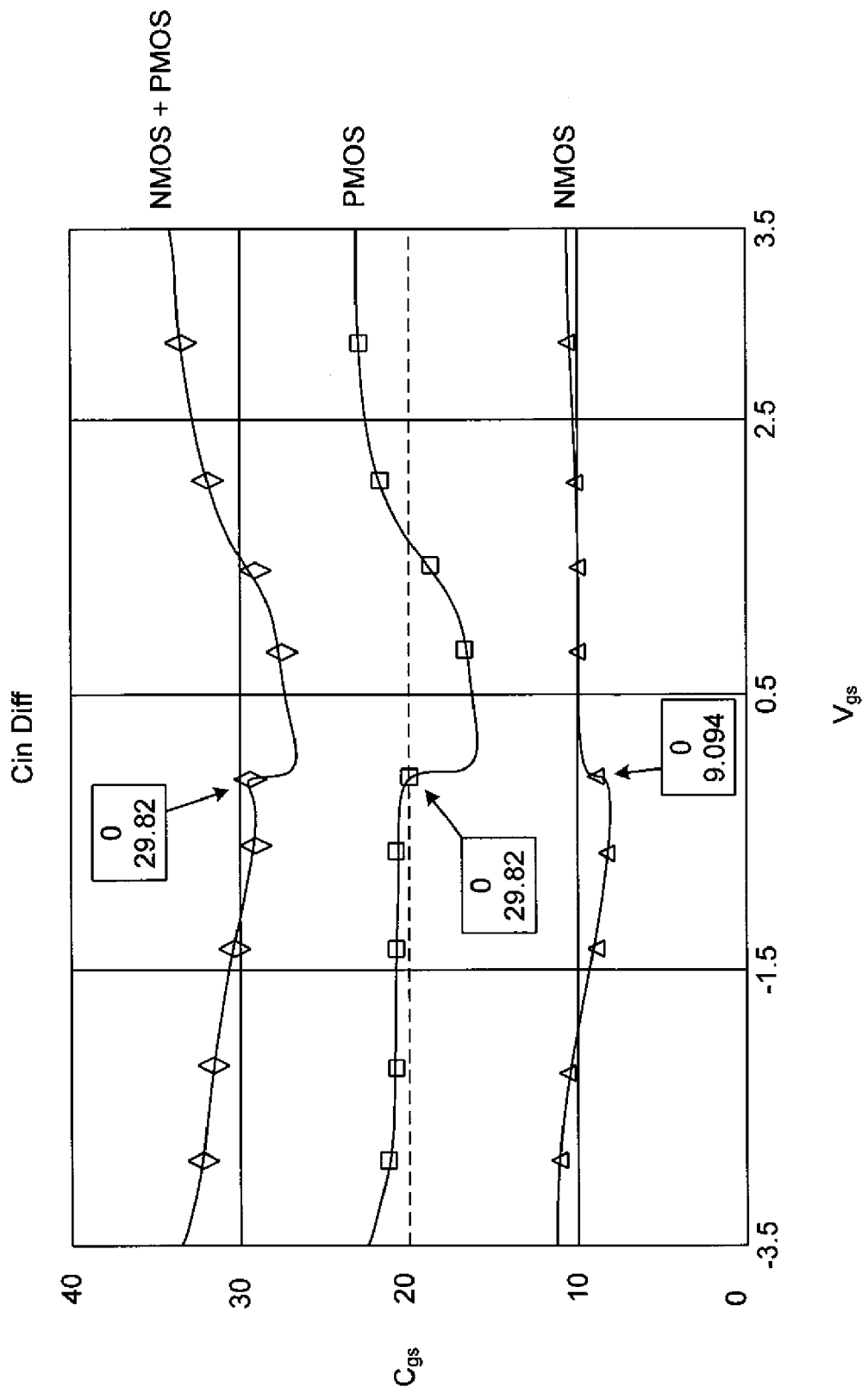
FIG. 1 is a graphical illustration of capacitance changes versus a gate-to-source voltage.

Embodiments may be used to improve linearity of an amplifier, and more particularly to improve phase linearity of a PA such as a CMOS PA. However, the techniques described herein may be used to improve linearity of CMOS devices in circuits beyond PAs. As will be described further below, embodiments may improve linearity by compensating for capacitance changes that occur to a device as it is provided with varying input signal levels. More specifically, as transistors dynamically change their characteristics when conducting in different operating regions, different inherent or parasitic capacitances may exist. Embodiments may attempt to reduce or remove the effects of such capacitance changes.

As discussed above, in certain applications, non-linear capacitance may occur over varying operating conditions. To compensate for such conditions, a compensation mechanism may be provided. In PA applications in which an amplifier gain stage includes one or more MOS transistors, a compensation circuit may also be formed of MOS transistors. One method of performing non-linear capacitance compensation is to use complementary MOS transistors with appropriate biasing and sizing to effectively generate a Cgg profile that compensates the Cgg profile of the gain stage MOS transistor (referred to herein as a main device). For a gain stage having an n-channel MOSFET (NMOS) main device, a p-channel MOSFET (PMOS) compensation device may be provided.

In a CMOS gain stage such as used in a PA, MOS devices can be configured as a complementary common-source amplifier in which multiple metal oxide semiconductor field effect transistors (MOSFETs), namely a p-channel MOSFET (PMOS) and an n-channel MOSFET (NMOS), are driven at the gates by an incoming signal and have their drain terminals coupled together to provide an amplified version of the input signal. In this case, the gate-to-source capacitance ($C_{gs}$) of the NMOS and PMOS devices are the main source of AM-to-PM distortion. This is caused by the significant change in $C_{gs}$ as the input signal amplitude ($V_{gs}$) increases. For a high efficiency PA, a gain stage is typically biased Class AB or B, where the MOS devices are nearly off. As the input signal RMS value increases to a larger level than the quiescent, the devices' average operating point is shifted to a more "on" condition. This shifting operating condition causes a change in the devices' channel charge, and hence a change in the average $C_{gs}$.

This capacitance change typically happens near the threshold voltage of the devices, where they begin to conduct significantly. For example, if a device is instantaneously off at a point in time and there is no current through the device, a channel has no significant charge, and thus the capacitance seen on the input to a very small signal is also very small. When an input voltage starts to swing upwards and starts to turn the device on, the device starts to conduct, and the channel begins to gain some charge in it, and the device essentially acts like parallel plates such when there is no charge in a channel, the plates are far apart, but as a charge begins to build in the channel, the plates become closer together. Thus as the device turns on, the plates come closer together and capacitance increases rapidly.

In various embodiments, different techniques may be used to generate a bias voltage, e.g., for a compensation circuit. More specifically, in some implementations a bias voltage may be generated that is substantially around a sum of threshold voltages of two or more MOS devices. For example, in an embodiment in which the bias voltage is to be provided to a compensation device that compensates for capacitance non-linearity of a main device, the threshold voltage sum may be that of the threshold voltages for devices of the compensation circuit as well as the main circuit.

Still further, embodiments may provide various process monitoring circuits that can track process and temperature and can be used in a wide variety of applications including PAs. In general, the circuit can include elements that vary with regard to voltage and temperature but are independent of threshold voltage. Then, an output of this tracking circuit can be used to generate a threshold voltage for a main device that tracks variations due to process and temperature.

One such monitoring circuit is referred to herein as a "$\mu C_{OX}$" tracking circuit that tracks the mobility ($\mu$) of either electrons or holes (depending on the type of metal-oxide-semiconductor field effect transistor (MOSFET) device) and oxide thickness $T_{OX}$, which manifests itself in the oxide capacitance ($C_{OX}$) term. This circuitry suppresses the tracking of the threshold voltage, but tracks several second order effects in a MOS transistor including short-channel effects.

This $\mu C_{OX}$ tracking circuit can also be used to generate a threshold voltage, e.g., using a threshold voltage generation circuit, in different ways. Embodiments may also enable programming or fine control of both the $\mu C_{OX}$ tracking and voltage generation circuits.

Referring now to FIG. 1, shown is a graphical illustration of small-signal capacitance changes occurring over a corresponding change in bias voltage (a.k.a. operating point). Specifically, FIG. 1 shows capacitance changes for a NMOS device and a PMOS device as the $V_{gs}$ for these devices varies. As shown in FIG. 1, while the capacitance of each device does vary over $V_{gs}$, note that a rapid change occurs at a $V_{gs}$ level substantially around a threshold voltage level of the given device. FIG. 1 also shows the combined capacitance changes of the two devices, which corresponds to total input capacitance for the NMOS $C_{gs}$ and the PMOS $C_{gs}$. Thus FIG. 1 shows the capacitance change of a small signal $C_{gs}$ versus a DC bias value ($V_{gs}$) for individual NMOS and PMOS devices, as well as a total input capacitance for the NMOS $C_{gs}$ and the PMOS $C_{gs}$.

Consider a sinusoidal input signal, $V_{gs}$. Conceptually, as the instantaneous voltage changes, the input capacitance also changes. Thus, the input signal traces a path on a capacitance vs. voltage plot diagram such as that of FIG. 1. As the peak voltage of the sine wave increases, the capacitance wave changes significantly. For a given $V_{gs}$ amplitude, the time-average value of the capacitance wave is the critical quantity for AM-to-PM distortion. As the time-average $C_{gs}$ changes with input amplitude, the phase shift of the gain stage will change. It is this phase change that gives rise to AM-to-PM distortion.

Figure 2A:
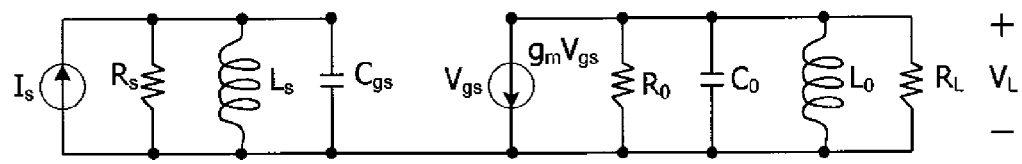
FIG. 2A is a small signal model of a CMOS gain stage.

The functional relation of the phase shift to the change in $C_{gs}$ can be determined using a small signal model of a gain stage. Referring now to FIG. 2A, shown is a small signal model of a CMOS gain stage coupled between a source, represented as a current source $I_s$, a source resistance $R_S$ and a source inductance $L_S$, and a load. The small signal model of the gain stage itself is represented as a capacitance, $C_{gs}$, a current source of $gmV_{gs}$ and an output resistance, capacitance, and inductance ($R_O$, $C_O$, $L_O$), which is coupled to a load, represented by a load resistance $R_L$. Let $R_S$ include any losses from $L_S$ (in parallel form). $C_{gs}$ equals $C_{gs0}$ and $\Delta C_{gs}$, where $C_{gs0}$ is the small-signal input capacitance. $L_S$ is resonant with $C_{gs0}$ at the center frequency, $\omega_o$. $R_L$ includes loss from $L_O$ and $R_O$, and $L_O$ is resonant at the center frequency with $C_O$.

Figure 2B:
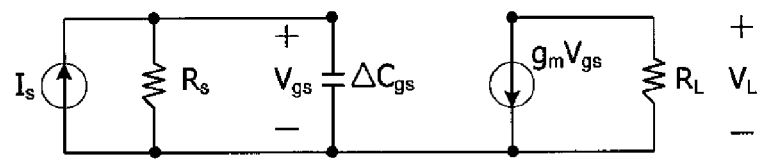
FIG. 2B is a small signal model of a CMOS gain stage operating at a center frequency.

Note that in this small signal model, at frequencies near a center frequency, which may correspond to a center frequency at which the gain device operates, e.g., a center frequency of a RF frequency of a given communication system (e.g., a 1800 megahertz (MHz)), the small signal model of FIG. 2A may be represented by the small signal model set forth in FIG. 2B. With reference to the small signal model of FIG. 2B, near a center frequency $\omega=\omega_o$, $$\Delta \text{Phase Shift} = \angle V_L/I_S = -\tan^{-1}(\omega \Delta C_{gs} R_s) \approx -\omega \Delta C_{gs} R_s$$

$$\therefore \Delta \Phi = -\tan^{-1}(\omega \Delta C_{gs} R_s) \approx -\omega \Delta C_{gs} R_s.$$

Extracting the total input capacitance under large-signal conditions, the (uncompensated) capacitance decreases at medium input levels. In an example system, assume a $\Delta Cgs \cong -1.8$ picoFarads (pF), with $R_S=100\Omega$ and a 900 MHz center frequency, the phase shift is approximately 45°, which can cause significant phase distortion.

To reduce or prevent such phase distortion, an open-loop compensation approach can be provided, in various embodiments. More particularly, embodiments may use a complementary device as a capacitor that compensates for the change in $C_{gs}$ of the gain device. For compensation to be effective, the compensation device area can be scaled with reference to the gain device area so that changes in capacitance in a rapid transition region are approximately equal. As used herein, the term "rapid transition region" refers to a portion of a signal range (either as a function of input signal, $V_{gs}$ or other voltage level) at which rate of the capacitance change is substantially higher than at other portions of the voltage level. This region is related to a threshold voltage of the device, and thus the rapid transition region may also be used to refer to the devices themselves.

A compensation bias source can be set so that the rapid transition regions (for gain device and compensation device) align with respect to input voltage. In some implementations, the compensation device can be approximately half the area of the gain device, and the corresponding compensation bias can be approximately $V_{DD}-V_{TN}-|V_{TP}|$, where $V_{DD}$ is supply voltage and $V_{TN}$ and $V_{TP}$ are threshold voltages for the NMOS and PMOS devices, respectively.

Figure 3A:
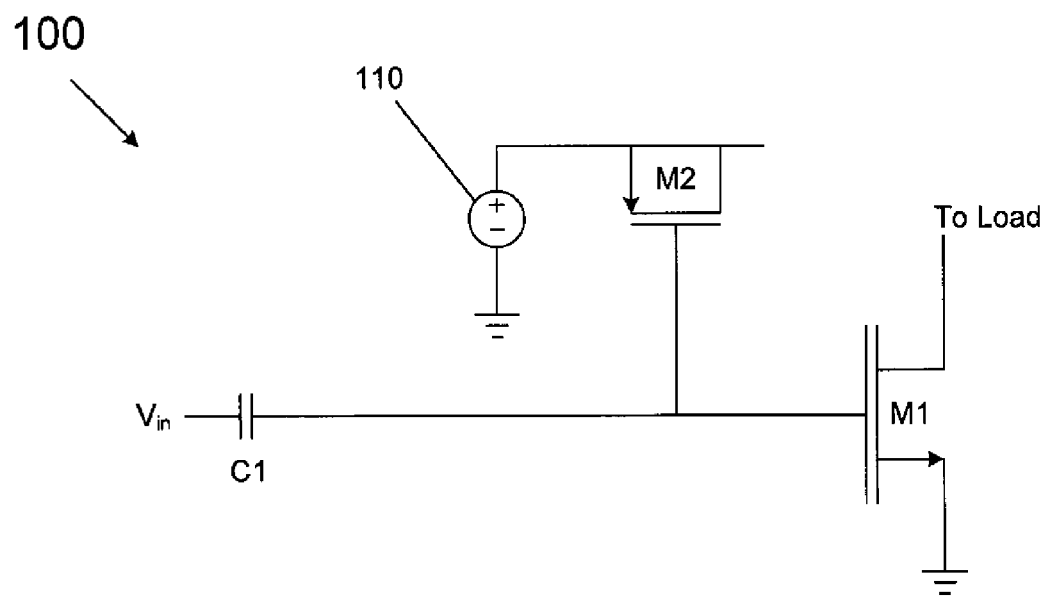
FIG. 3A is a schematic diagram of a compensation circuit in accordance with one embodiment of the present invention.

Referring now to FIG. 3A, shown is a schematic diagram of a compensation circuit in accordance with one embodiment of the present invention. As shown in FIG. 3A, circuit 100 may be part of a gain stage of a power amplifier. More specifically, as shown in FIG. 3A, circuit 100 includes an amplifier formed of a MOSFET M1 which as shown is an NMOS device. As shown in FIG. 3A, circuit 100 may be coupled to receive an incoming signal $V_{in}$ through a capacitor C1 that acts as a DC block to thus couple an incoming AC signal, which may be an RF signal to be amplified for output from a handset or other wireless device, to MOSFET M1. While shown with this simple capacitance block, understand that in various implementations a large variety of coupling approaches can be used. As shown in FIG. 3A, this input signal is coupled to transistor M1, and more specifically to a gate terminal of the device. MOSFET M1 may be a common-source amplifier having a source terminal coupled to a reference voltage (e.g., a ground voltage) and a drain terminal coupled to a supply voltage through a biasing network, or to a drain terminal of a PMOS device (in a complementary implementation), to thus provide an amplified output signal to a load to which the gain stage is coupled. While not shown in the embodiment of FIG. 3A, understand that an output line coupled to the drain terminal of MOSFET M1 may provide the amplified signal to a further portion of a signal path of the power amplifier, e.g., to another gain stage, to an output matching network or so forth.

Figure 4A:
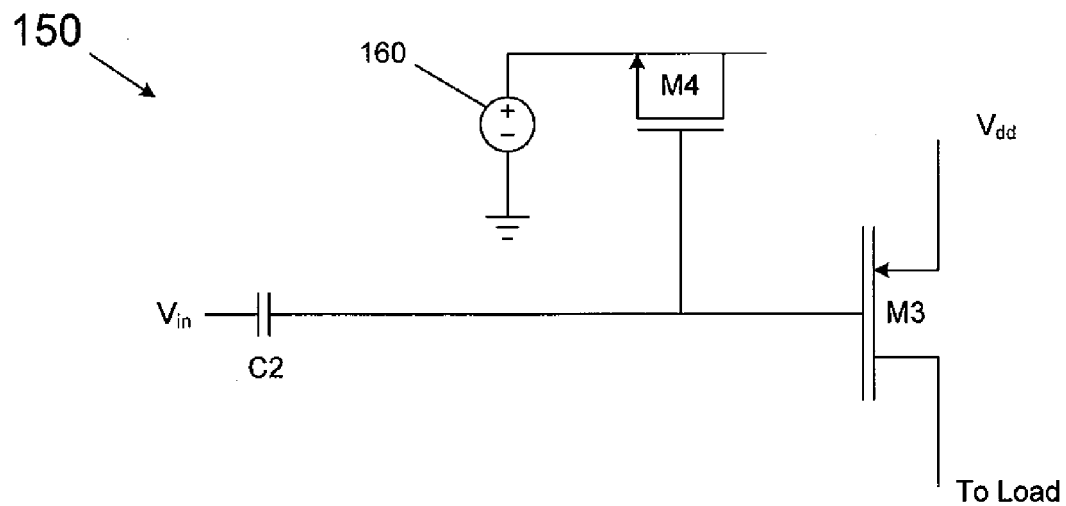
FIG. 4A is a schematic diagram of a compensation circuit in accordance with another embodiment of the present invention.

Still referring to FIG. 3A, to provide for open-loop compensation a second MOSFET, namely MOSFET M2, may be coupled to MOSFET M1. Specifically, as shown in FIG. 3A MOSFET M2 may be a so-called gate capacitor or MOS capacitor, formed of a MOSFET having source and drain terminals coupled together to act as a plate of the capacitor. Note that MOSFET M2 may be of complementary design, i.e., of opposite polarity to MOSFET M1 to thus provide the desired capacitance compensation. In the embodiment of FIG. 3A, MOSFET M2 may be a PMOS device. Note that in the embodiment of FIG. 3A, a bias source 110 is coupled to provide a bias voltage to these commonly coupled source and drain terminals, and the gate of MOSFET M2 is coupled to the gate of MOSFET M1. While shown in the embodiment of FIG. 3A as an NMOS device, understand that in other implementations an amplifier may be formed of a PMOS device with a corresponding NMOS compensation device, as shown in FIG. 4A below. Still further, as will be described below, an amplifier may be formed of complementary NMOS and PMOS devices coupled together. Furthermore, while shown with a single-ended implementation for ease of discussion in FIG. 3A, understand that various embodiments may have a differential design, and also in various implementations multiple gain devices may be coupled together in cascade fashion such that the input capacitance compensation may be applied to one or more of such gain devices. Still further, parallel gain stages may be present in some implementations. In some implementations, both input and output compensation devices may be present.

For example, such parallel gain stages may each be of a different size and each may be biased differently. In such an implementation, each gain device may have a capacitance compensation applied as described above. Each compensation device may similarly be biased with a different bias voltage. In this way, with the differently-valued bias sources both for gain devices and compensation devices, the transition region of the capacitance change can be effectively spread out. In yet other embodiments, the multiple parallel gain stages can be biased at the same point or at very different points (i.e., some on and some off). In each case, a compensation device can be separately applied to each parallel path and the compensation bias may be set for the corresponding gain device to which it is coupled.

Still further, a single gain stage may have multiple compensation devices connected in parallel thereto, with each such compensation device biased at slightly different points to thus spread out the non-linearity, and thus to spread out the transition region of the capacitance change.

The bias voltage for a compensation device may be set to track any changes in the gain device's bias, supply voltage, temperature, and process variations. The basic dependencies for the bias voltage for compensation can be understood by considering the physical processes that lead to the capacitance changes. For an NMOS device, as $V_{gs}$ increases from 0, while $V_{ds} > 0$, a channel is formed under the gate. This formation leads to a rapid increase in $C_{gs}$ with respect to $V_{gs}$ as the separation between capacitor plates is reduced. The device's $V_T$ determines the amount of charge in the channel for a given $V_{gs}$, which influences $C_{gs}$. Thus, $V_T$ strongly influences the value of $V_{gs}$ at which $C_{gs}$ goes through a rapid transition.

Likewise, the $V_T$ of a PMOS gain device determines the value of $V_{gs}$ at which the $C_{gs}$ of the gain device makes its rapid transition. Since the $V_{gs}$ of the PMOS gain device is referenced to the supply voltage ($V_{DD}$), the bias voltage for compensation may also be a function of $V_{DD}$. As described above, in some implementations, the bias voltage is approximately $V_{DD} - |V_{TP}| - V_{TN}$. Note that by shifting the burden of this bias generation design from RF to DC, many advantages appear, such as more design flexibility and easier implementation.

Figure 3B:
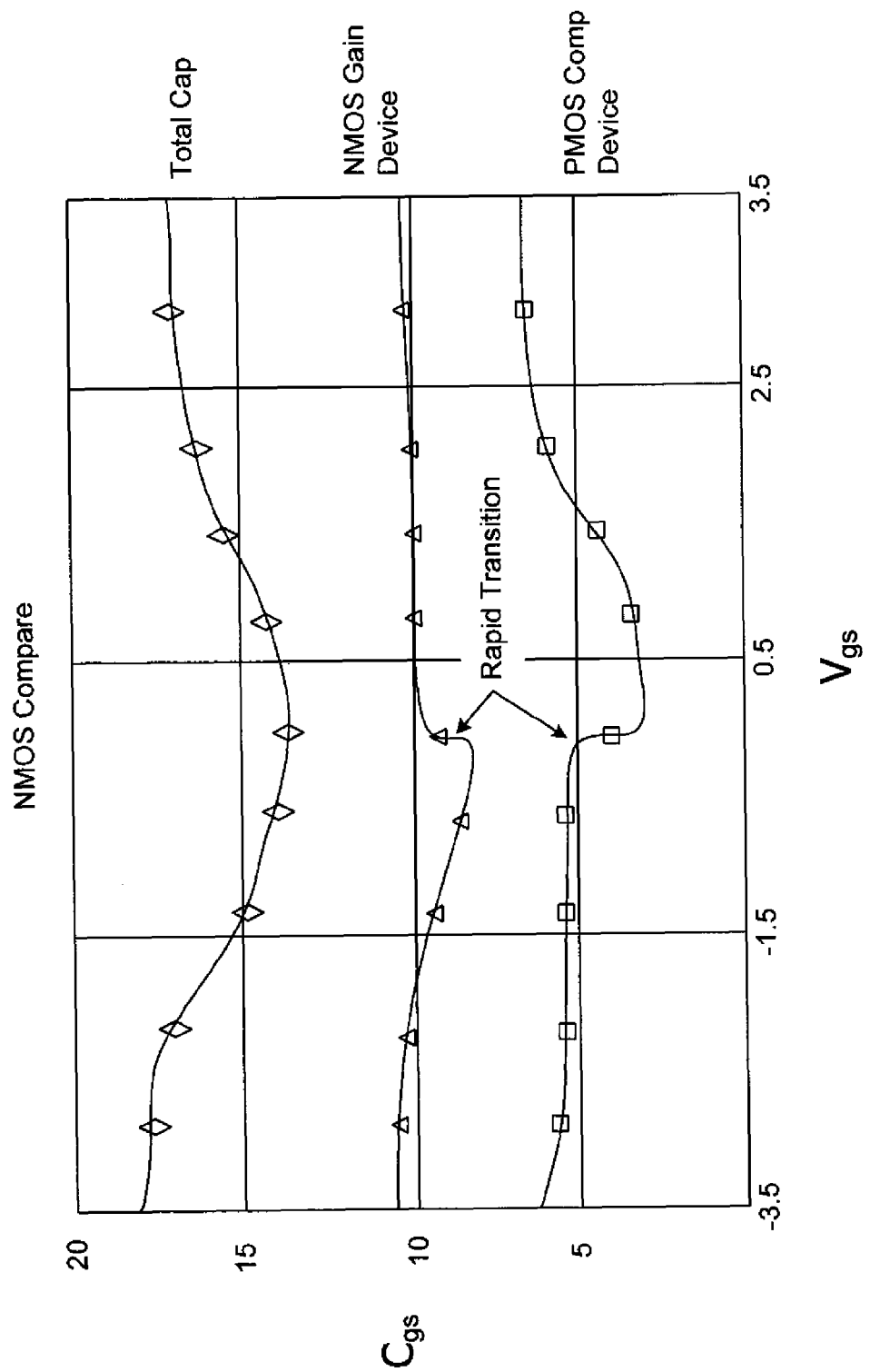
FIG. 3B is a graphical illustration of capacitance changes for the circuit of FIG. 3A.

Referring now to FIG. 3B, shown is a graphical illustration of capacitance changes (i.e., $\Delta C_{gs}$) that occur over changing input signal conditions (i.e., $\Delta V_{gs}$) for the circuit of FIG. 3A. Specifically, note that the NMOS gain device undertakes a large, rapid capacitance change substantially around a threshold voltage of the device, i.e., the rapid transition region. To thus compensate for this change, the PMOS compensation device may undergo an opposite and substantially equal capacitance change around this same value of the incoming signal. Thus as shown in the top curve of FIG. 3B, the total capacitance change that occurs is much smoother, with a significantly reduced rate of change of $C_{gs}$, improving phase linearity of the gain device. Note that even though the maximum change in capacitance before and after compensation is about the same, the compensated capacitance characteristic results in improved linearity. Thus what essentially provides the phase-linearity improvement is the slope reduction of the capacitance characteristic.

Figure 3C:
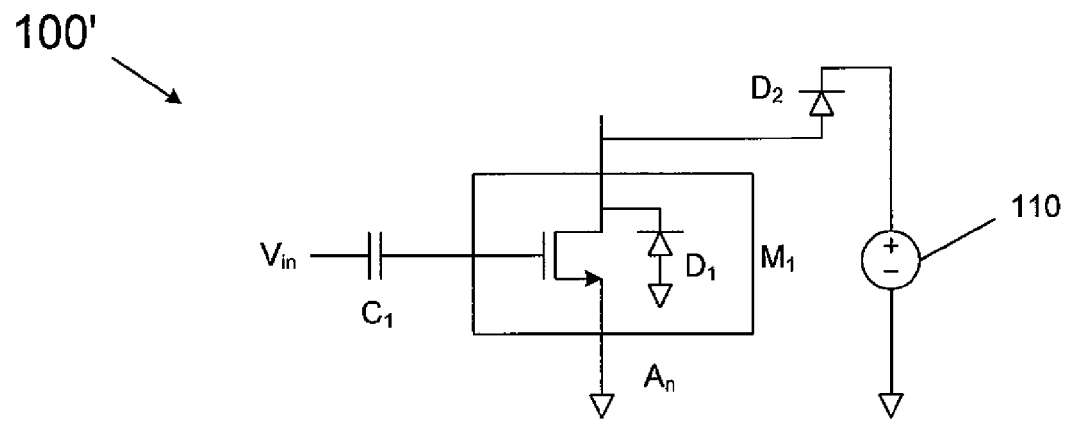
FIG. 3C is a schematic diagram of a compensation circuit in accordance with another embodiment of the present invention.

In some embodiments, there may be a variable capacitance on an output node of the gain device, which may be coupled from the drain to the source of the gain device and is variable. In this alternate embodiment, a complementary depletion capacitance may be coupled to compensate the output of the gain device for the capacitance change. Specifically, as shown in FIG. 3C, a circuit 100' may include a gain device M1 driven at the gate by an incoming signal that is AC coupled through a coupling capacitance C1. The box enclosing the NMOS gain device M1 also shows an inherent parasitic diode D1 that is formed at the drain terminal of the gain device. This diode is of the type N+:P-well, where the N+ corresponds to the drain diffusion, and the P-well is the other terminal of the diode. To provide for output capacitance compensation, a similar diode structure D2 may be realized by a N+ diffusion in a P-well and connected to an appropriate bias voltage 110 as shown in the FIG. 3C. It is noted that other diodes structures can also be used. If the NMOS drain area is $A_n$, then the diode will have an area that is appropriately scaled: $C_1 \times A_n$ such that the total capacitor (which is the sum of the intrinsic drain diode of the NMOS gain device and the compensation diode) variation as a non-linear function of the output signal levels (which in turn depends on the input signal levels) is minimized.

Figure 3D:
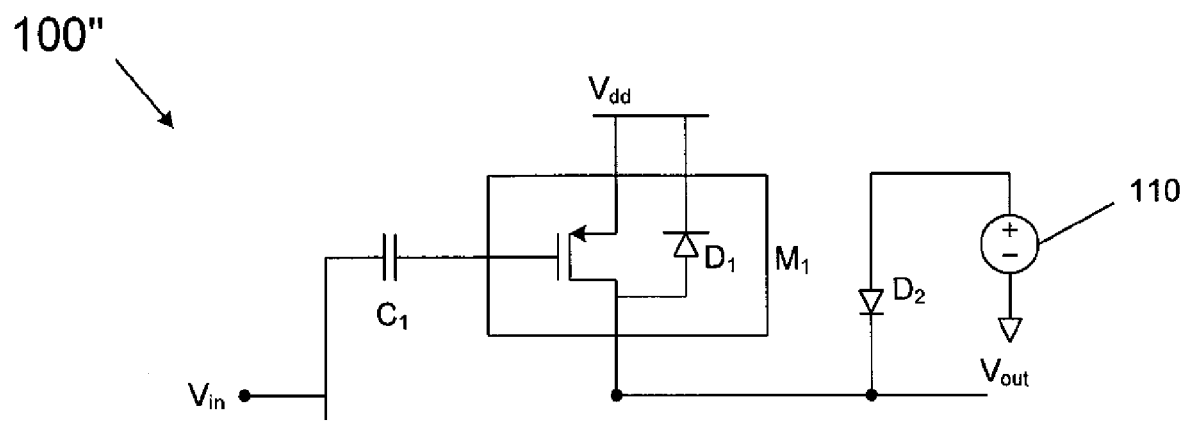
FIG. 3D is a schematic diagram of a dual circuit to the compensation circuit of FIG. 3C.

FIG. 3D is a schematic diagram of a dual circuit to the compensation circuit of FIG. 3C. Specifically, FIG. 3D shows a circuit 100" that includes a PMOS gain device M1 having an inherent parasitic diode D1 that is a P+ type N-well diode, while compensation diode D2 is formed as an P+ diffusion in a N-well connected to bias voltage 110.

Figure 3E:
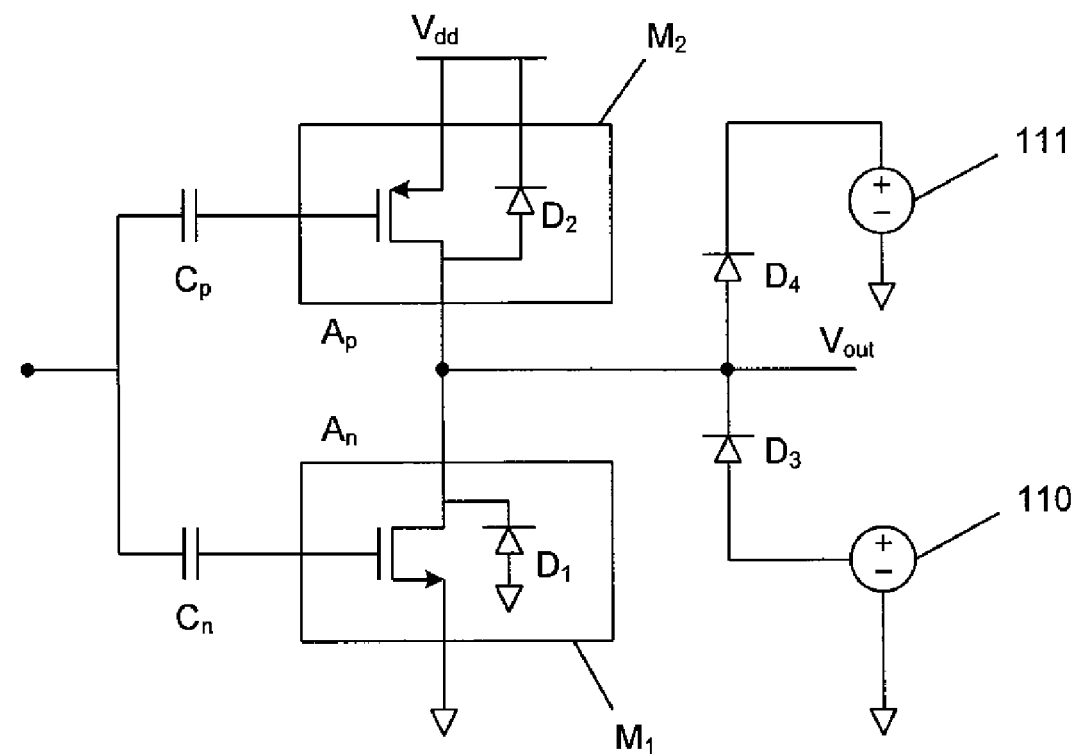
FIG. 3E is a schematic diagram of a complementary compensation circuit in accordance with one embodiment of the present invention.

In yet other implementations, a complementary version including both NMOS and PMOS devices, such as of a complementary gain stage may be provided. Referring now to FIG. 3E, shown is a schematic diagram of a CMOS embodiment. As shown in FIG. 3E, circuit 100''' includes an NMOS gain path AC coupled through a coupling capacitance $C_N$ and a PMOS gain path AC coupled through a coupling capacitance $C_P$. Complementary gain devices M1 and M2 thus provide an output signal $V_{out}$ that is compensated by output compensation diodes D3 and D4, which are each coupled between the commonly coupled drain terminals of gain devices M1 and M2 and corresponding bias sources 110 and 111.

Figure 4B:
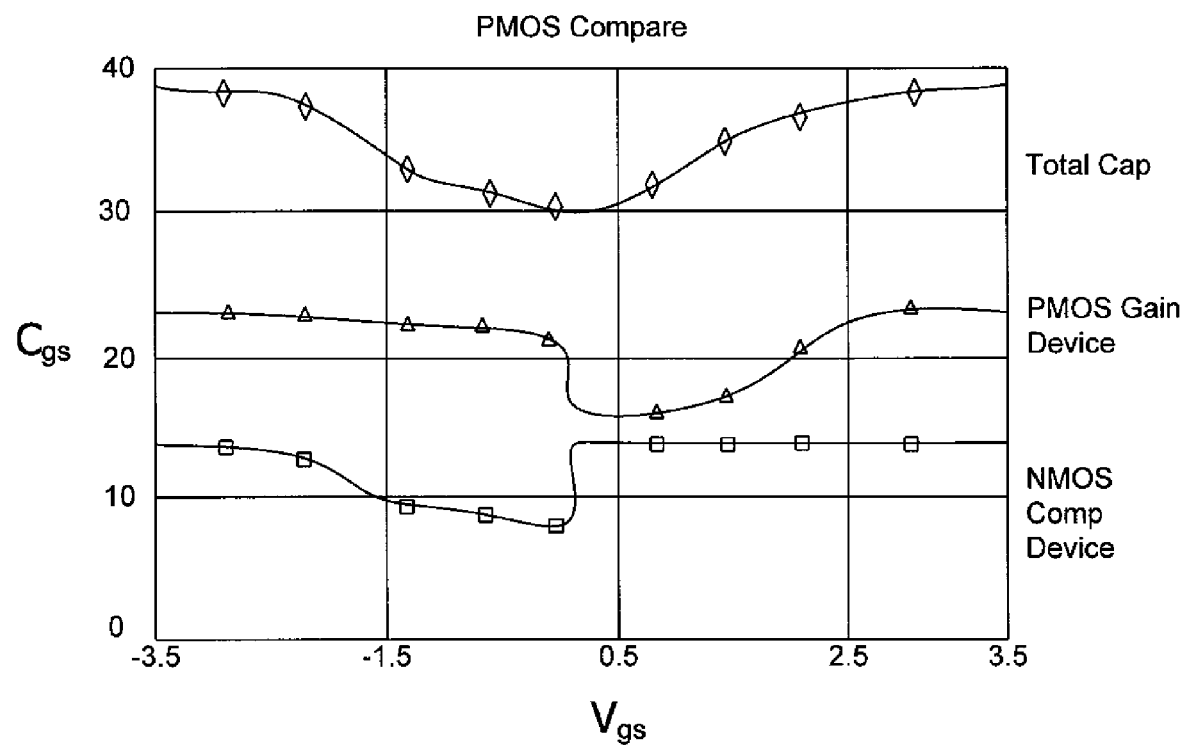
FIG. 4B is a graphical illustration of capacitance changes for the circuit of FIG. 4A.

FIG. 4A shows a similar amplifier to that of FIG. 3A, but having a PMOS gain device. Specifically, as shown in FIG. 4A, circuit 150 may be part of a gain stage of a power amplifier, and includes a MOSFET M3 which as shown is a PMOS device having a source terminal coupled to a supply voltage and a drain terminal to provide an amplified version of an incoming signal to a load to which the gain stage is coupled. Circuit 150 may be coupled to receive an incoming signal $V_{in}$ through a capacitor C2 that acts as a DC block to thus couple an incoming AC signal, which may be an RF signal to be amplified to MOSFET M3. While shown with this simple capacitance block, understand that in various implementations, a large variety of coupling approaches can be used. A second MOSFET, namely MOSFET M4, may be coupled to MOSFET M3. Specifically, MOSFET M4 may be a MOS capacitor with commonly coupled source and drain terminals. Note that MOSFET M4 is a NMOS device. A bias source 160 is coupled to provide a bias voltage to these commonly coupled source and drain terminals, and the gate of MOSFET M4 is coupled to the gate of MOSFET M3. Circuit 150 may operate in complementary fashion to that of circuit 100 of FIG. 3A. FIG. 4B shows a graphical illustration of capacitance changes for the circuit of FIG. 4A.

To expand the concept of capacitance compensation set forth in FIGS. 3A and 4A to a complementary amplifier, the NMOS and PMOS gain devices of the figures may have their drain terminals coupled together such that the circuitry present in these figures is combined to provide for complementary operation.

Figure 5:
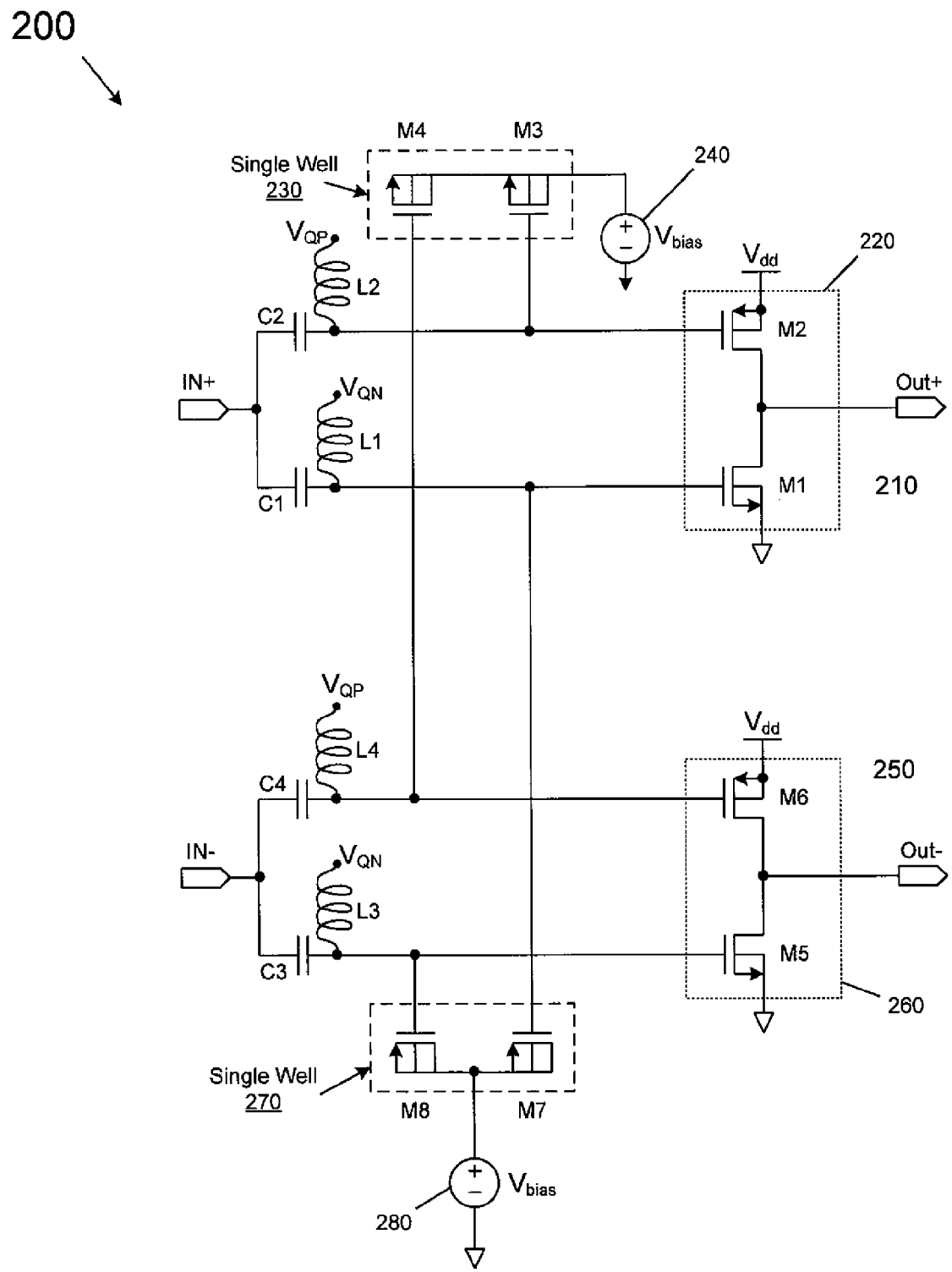
FIG. 5 is a conceptual schematic diagram of a compensation circuit in accordance with another embodiment of the present invention.

Referring now to FIG. 5, shown is a schematic diagram of a compensation circuit in accordance with another embodiment of the present invention. As shown in FIG. 5, circuit 200 may be differential amplifier having a positive portion (or p-side) 210 coupled to receive a positive portion of an incoming differential signal, In+, and a negative portion (or n-side) 250 coupled to receive a negative portion of the differential signal, In−. These signals may be driven (ideally) with equal amplitudes of 180° phase difference.

As shown in FIG. 5, first portion 210 includes a gain stage 220 and second portion 250 includes a gain stage 260. In addition, two compensation stages 230 and 270 may be provided, each of which is coupled to parts of the first and second portions, as will be described further below. As shown in the embodiment of FIG. 5, gain stage 220 includes a pair of complementary MOSFETs M1 and M2. In turn, gain stage 260 includes complementary MOSFETs M5 and M6. These gain stages are coupled to receive respective incoming signals at their gate terminals through a DC block formed of capacitors C1-C4. Still further, a bias voltage is supplied via these capacitors and inductors L1-L4, coupled between the input lines and respective bias voltages $V_{QP}$ and $V_{QN}$, to provide a bias voltage for these gain stages. Of course, other coupling and biasing approaches exist and may instead be used.

Compensation stages 230 and 270 are provided to improve phase linearity by decreasing the rate of a capacitance change occurring around the threshold voltages of the devices that form the gain stages. As shown, compensation stage 230 is formed of a pair of NMOS transistors M3 and M4, both of which have source and drain terminals coupled to a bias voltage obtained from a bias generator 240. In turn, gate terminals of these devices are differentially driven by the input signals to the PMOS devices of gain stages 220 and 260, namely MOSFETS M2 and M6. Similarly, compensation stage 270 is formed of a pair of PMOS transistors M7 and M8, both of which have source and drain terminals coupled to a bias voltage obtained from a bias generator 280. In turn, gate terminals of these devices are differentially driven by the input signals to the NMOS devices of gain stages 220 and 260, namely MOSFETS M1 and M5.

Note that bias generators 240 and 280 may be set at approximately the same bias level. Further, in some implementations only a single bias source may be provided and coupled to all compensation devices, although for certain implementations, providing separate bias generators for the different compensation stages may ease layout and routing issues. Thus in circuit 200, the differential output signal, Out +/− obtained at the common drain terminals of the complementary devices of each gain stage is provided with greater linearity across its operating range.

For proper bias, the bulk of the compensating devices are DC isolated from other devices. In various CMOS processes a deep N-well may be provided for the NMOS compensation devices. As shown in FIG. 5, in a differential application, there are four compensation devices for the differential amplifier: two NMOS compensation devices (M3 and M4) driven differentially and two PMOS compensation devices (M7 and M8) driven differentially. By placing each pair of compensation devices close together in the same well, biasing of the well and bulk is more practical. This is because the two devices are driven differentially, and the return current of one device is through the second device, thus eliminating large currents through the bulk, which greatly simplifies a given bias implementation. That is, by providing a pair of compensation devices differentially driven, the biasing of the bulk becomes easier. In this way, the signal current does not leak off elsewhere, causing complications. This also eases the design of the bias source, as it does not need to provide the large signal currents, and hence can be implemented in small area with very little power consumption.

Figure 6A:
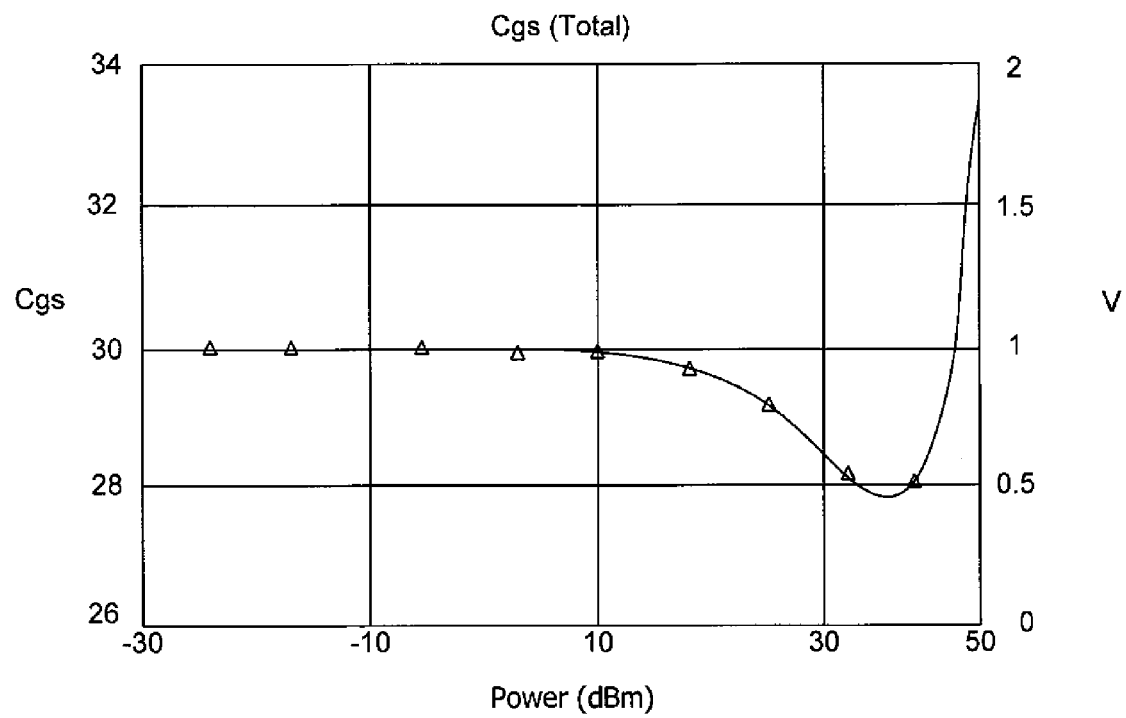
FIG. 6A is a graphical illustration of capacitance changes without compensation in accordance with an embodiment of the present invention.
Figure 6B:
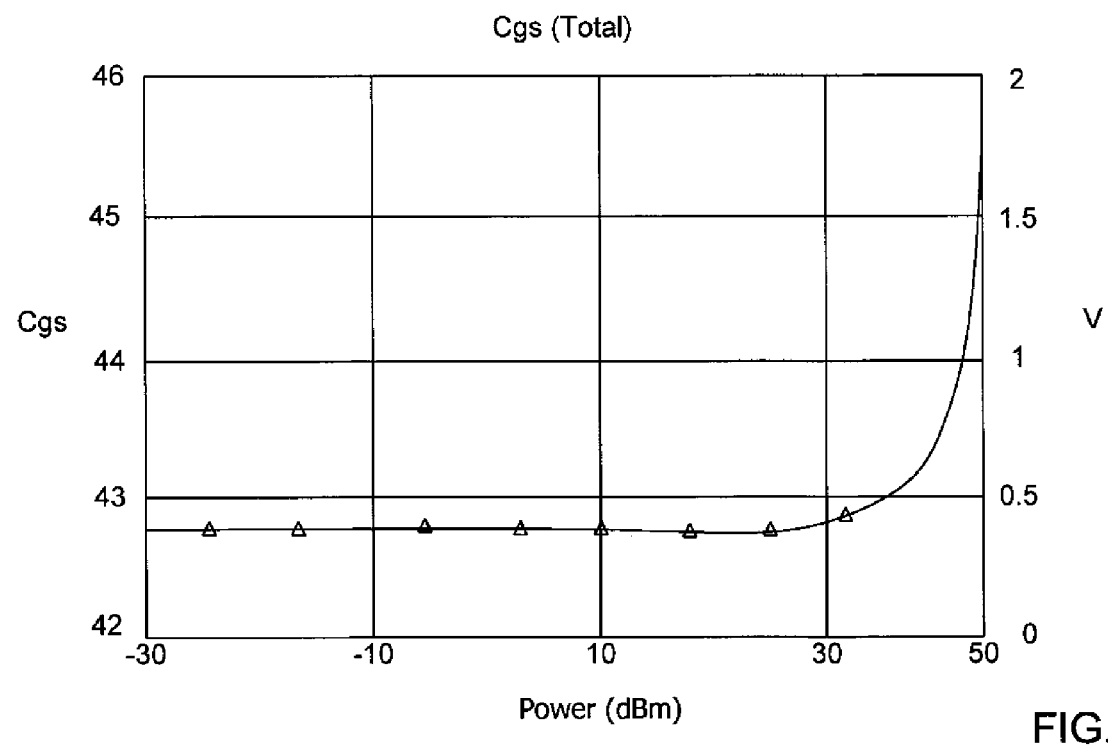
FIG. 6B is a graphical illustration of capacitance changes with compensation in accordance with an embodiment of the present invention.

Thus, by providing one or more compensation devices for a gain stage, reduced capacitance changes may occur, improving phase linearity. Referring now to FIG. 6A, shown is a graphical illustration of capacitance changes over varying RMS input levels over an operating region of an example PA, without capacitance compensation in accordance with an embodiment of the present invention. As shown in FIG. 6A, as input power (related to the RMS value of the input voltage) increases, a relatively large decrease in capacitance occurs at medium input-power levels. For example, as described above with regard to the small signal model, a change of approximately −1.8 pF can be realized at a medium input-power levels for a 900 MHz signal, leading to a phase change of approximately 45° without use of a compensation technique as disclosed herein. In contrast, using embodiments of the present invention such as that illustrated with circuit 200 of FIG. 5, over medium input-power levels, a substantially reduced capacitance change occurs, as shown in the graphical illustration of FIG. 6B. Thus it is noted that the total capacitance is not independent of $V_{gs}$, but the slope (max) has been significantly reduced. For example, see the slope differences between FIG. 1 (showing a significant slope change without capacitance compensation) and FIGS. 3B and 4B (showing a smooth change in total capacitance across differing $V_{gs}$ levels). With this compensation, a large-signal input shows significantly less variation in input capacitance in the medium-input power levels range. At the point of amplitude compression, and referring back to the same exemplary parameters discussed above, $\Delta C_{gs} \approx 0.08$ pF and the phase distortion is reduced to approximately 3°.

Figure 7A:
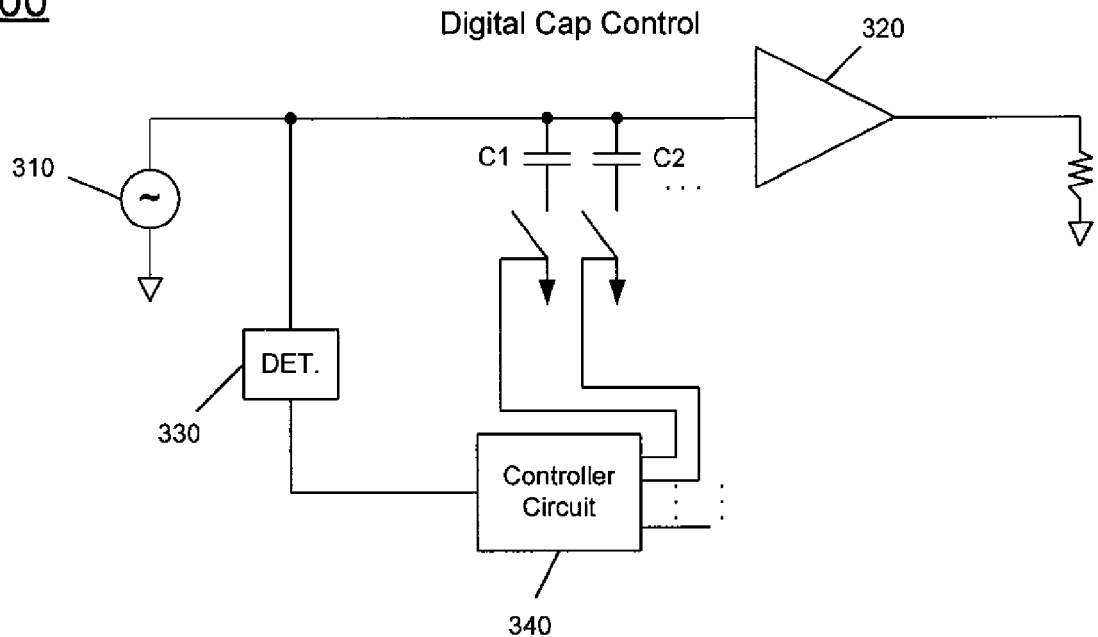
FIG. 7A is a schematic diagram of a closed loop system in accordance with one embodiment of the present invention.
Figure 7B:
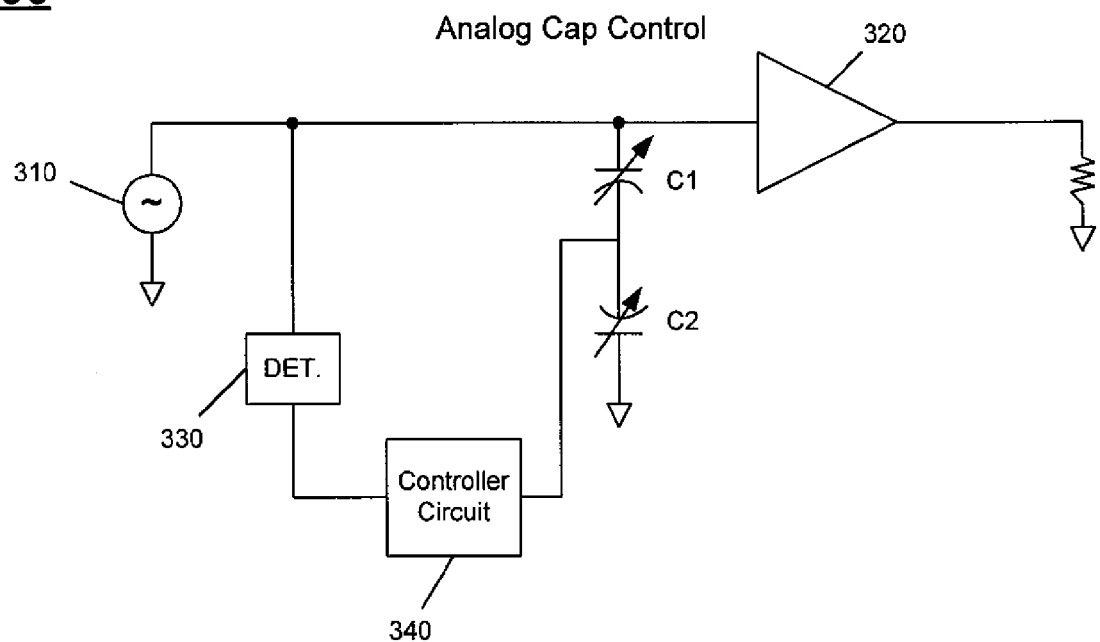
FIG. 7B is a schematic diagram of a closed loop system in accordance with another embodiment of the present invention.

In other implementations, rather than an open loop approach, a closed loop system can be provided to obtain feedback regarding a level of an incoming signal and adjust a controllable element to provide a desired amount of capacitance to the gain device. Referring now to FIG. 7A, shown is a schematic diagram of a closed loop system in accordance with one embodiment of the present invention. As shown in FIG. 7A, system 300 includes a signal source 310, which may be a portion of a handset through a transceiver that thus provides an RF signal to an amplifier 320, such as a gain stage of a PA of the handset. To enable capacitance compensation in accordance with an embodiment of the present invention, a detector 330, which may be an amplitude detector (e.g., a RMS or peak detector) may be coupled to detect an amplitude of the incoming signal. In various embodiments, the amplitude detected may be a voltage amplitude or current amplitude. This detected amplitude may be provided to a controller 340, which may be an analog or digital control circuit, either present within a PA, or part of other circuitry of a handset or other device. Based on the input level, control signals may be provided to variable capacitors C1 and C2 to thus switch in a desired amount of capacitance to the input of gain stage 320. As one example, controller 340 may include a lookup table that is coupled to receive as an input the amplitude of the signal and to output a control value to capacitor C1 and/or C2 to thus switch in the desired amount of capacitance (which may be a negative value, in some implementations). The values present in the lookup table may be generated based on empirical analysis, small signal modeling or so forth. In various implementations, the variable capacitors can be a bank of discrete fixed capacitors with digital control. Alternately, in other implementations in a system 300', such as shown in FIG. 7B, the controllable capacitances can be varactors with analog control.

In operation, a closed loop system may provide capacitance compensation as follows. First, the input signal amplitude may be detected, and an amount of capacitance to be coupled to the gain stage may be determined responsive to this detected amplitude. Note that this capacitance thus may compensate for a non-linear phase response of the gain stage to the input signal. Then, based on the determined capacitance, the controllable element, which can be a variable capacitance, a varactor with analog control or so forth, can be controlled to couple the determined amount of capacitance to the gain stage.

Figure 8:
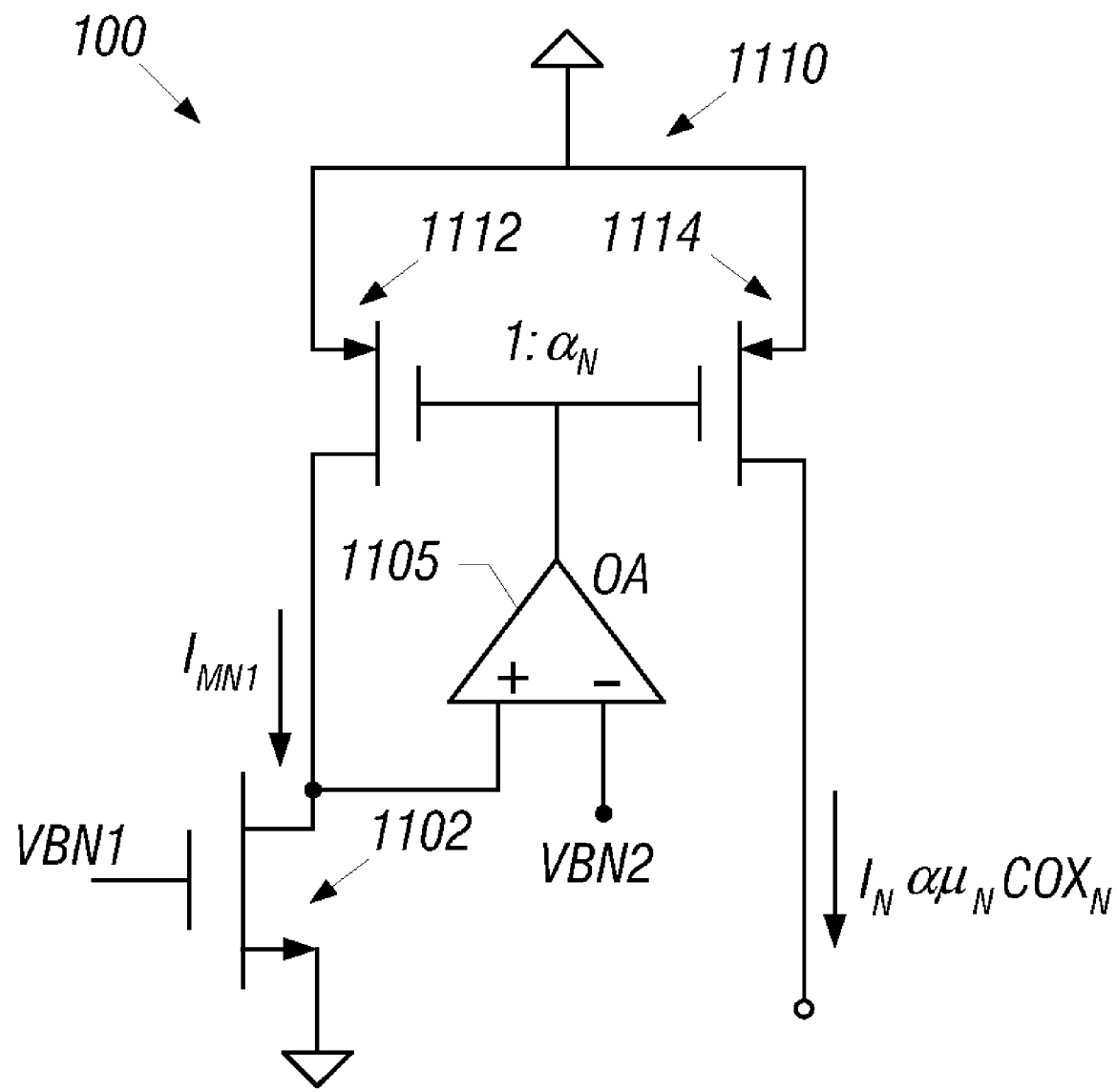
FIG. 8 is a schematic diagram of a tracking circuit in accordance with one embodiment of the present invention.

As described above, to generate a proper bias voltage to provide to a compensation circuit, first a threshold voltage-independent measure of process can be determined. More specifically, this threshold voltage-independent measure may be of mobility and oxide thickness in a MOS device. Then this process measure, which varies with temperature but is independent of threshold voltage, can be used to generate a bias voltage. Referring now to FIG. 8, shown is a schematic diagram of a tracking circuit in accordance with one embodiment of the present invention. As shown in FIG. 8, circuit 1100 may generate a current that is proportional to $\mu C_{OX}$ where "$\mu$" is the mobility of the MOS transistor and "$C_{OX}$" is the oxide capacitance, which is inversely proportional to the oxide thickness, "$T_{OX}$." As seen in FIG. 8, a tracking device 1102 may be an NMOS device having a source terminal coupled to a reference potential, a gate terminal coupled to a bias voltage $V_{BN1}$, and a drain terminal coupled to a comparator (such as an operational amplifier 1105) and a first device 1112 of a current mirror 1110.

This tracking device may have a predetermined relationship with a main device. It is to be understood that in many implementations multiple unit devices having a common aspect ratio (i.e., W/L) may be connected in parallel to form a main device. In turn, to provide a tracking device that monitors process and temperature changes with regard to the main device, the tracking device may be formed of one or more unit structures having the same aspect ratio as the unit structure of the main device. By using a unit structure with the same aspect ratio, second order effects can be tracked. Still referring to FIG. 8, the current from tracking device 1102 is coupled to a positive input terminal of amplifier 1105 and a corresponding drain terminal of current mirror device 1112, which in turn has a commonly coupled gate terminal with a second current mirror device 1114 (and with which it also has commonly coupled source terminals). These gate terminals are coupled to receive the output of op amp 1105, which has a negative gate input terminal to receive a second bias voltage ($V_{BN2}$) In turn, the drain terminal of current mirror device 1114 provides an output current $I_N$, which tracks the process parameters such as mobility and oxide thickness for tracking device 1102, but suppresses the effect of the dependence of this output current on the threshold voltage of tracking device 1102, depending on choice of bias voltages $V_{BN1}$ and $V_{BN2}$. If the tracking device 1102 is biased in the triode region of operation, a simple expression for $I_{MN1}$ (ignoring short channel and second order effects) is as follows:

$$I_{MN1} = \mu C_{OX} \frac{W}{L}(V_{BN1} - V_{TN})V_{BN2} \qquad [\text{EQ. 1}]$$

where W/L is an aspect ratio of the tracking device and $V_{TN}$ is a threshold voltage of the tracking device.

Note that current mirror 1110 can be drawn in several forms. The basic point is that the device 1102 is biased with a $V_{GS}=V_{BN1}$ and $V_{DS}=V_{BN2}$ by using amplifier 1105 and current mirror 1110. If $V_{BN1}$ is much greater than $V_{TN}$ then $I_{MN1}$ is proportional to $\mu C_{OX}$ (approximately) for MOS devices. In other words, by setting the $V_{GS}$ at a high voltage (e.g., as high as possible in a given process), the threshold voltage ($V_{TN}$) is a small portion of the larger quantity, thus isolating or tracking out threshold voltage, making the $uC_{OX}$ circuit threshold voltage independent. The voltage source to provide $V_{BN1}$ may be obtained from a stable reference voltage independent of process and temperature, e.g., derived from a bandgap voltage, or from an external voltage. A more elaborate expression for the device $I_{DS}$ versus $V_{GS}$ can be written with second order effects. However, the above circuit tracks the second order effects while suppressing the effect of the threshold voltage of the tracking device. Note that the current generated by the current mirror can be converted to a voltage to generate a voltage proportional to $\mu C_{OX}$ while suppressing the threshold voltage, e.g., by providing a resistor on the output.

Figure 9:
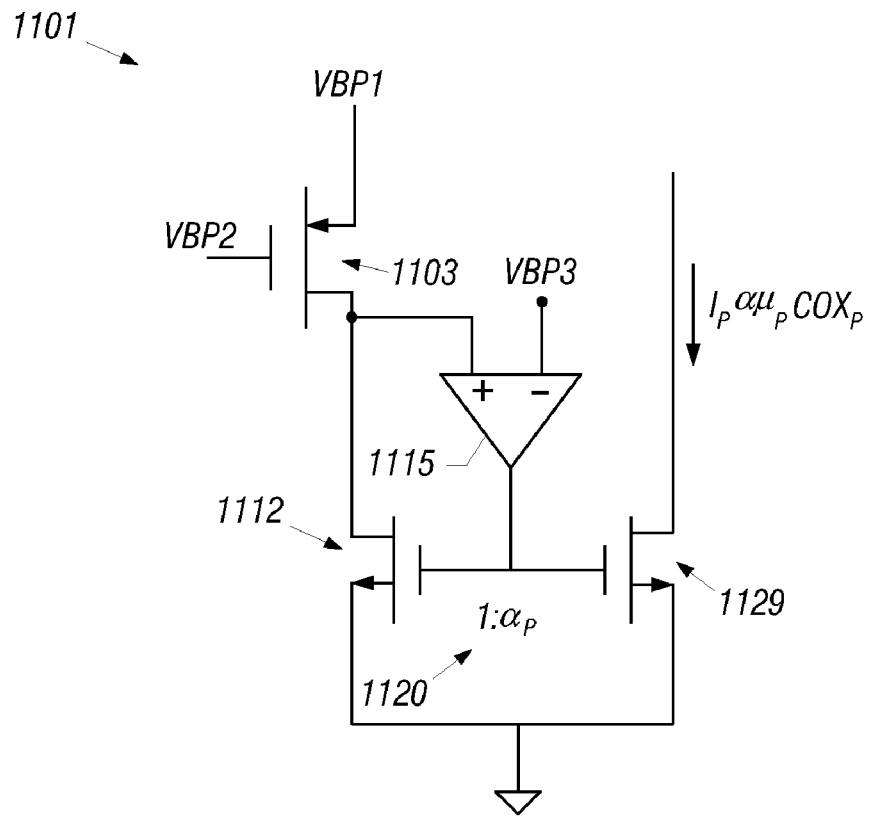
FIG. 9 is another schematic diagram of a tracking circuit in accordance with one embodiment of the present invention.

A similar scheme for generating a current proportional to $\mu C_{OX}$ for a PMOS device may also be provided. As shown in FIG. 9, a similar tracking circuit 1101 is provided. However, in this implementation, tracking device 1103 is an PMOS device that in turn is coupled to an op amp 1115 and a current mirror 1120 formed of NMOS devices 1122 and 1129.

An expression for the output current Ip, assuming device 1103 is biased in the triode region, is as follows:

$$I_P = \mu_P C_{OXP} \frac{W}{L}(V_{BP1} - V_{BP2} - |V_{TP}|)(V_{BP1} - V_{BP3}) \qquad [\text{EQ. 2}]$$

where W/L is an aspect ratio of the tracking device and $V_{TP}$ is a threshold voltage of the tracking device, and $V_{BP1}$, $V_{BP2}$, and $V_{BP3}$ are as shown in FIG. 9.

If $V_{SGP}$, which is given by $V_{BP1}-V_{BP2}$ is chosen to be much larger than $|V_{TP}|$ then the variation in $|V_{TP}|$ is suppressed (i.e., tracked out) and $I_P$ is substantially proportional to the other process parameters (i.e., $\mu C_{OX}$).

Note that in Equations 1 and 2 above, all bias voltages can be derived from a stable bias voltage independent of process and temperature such as a bandgap voltage or an external voltage so as to minimize dependence of generated currents on other variations. Although operation of the above-described circuits is valid for any aspect ratio, the tracking device may be biased in the triode region to minimize power dissipation.

Embodiments may also cause tracking devices 1102 and 1103 to be biased in the saturation region, although it may consume more power depending on how the device sizes are chosen. The fundamental principle however is to suppress the threshold voltage dependence for $I_{DS}$ by applying a large $V_{GS}$.

Figure 10:
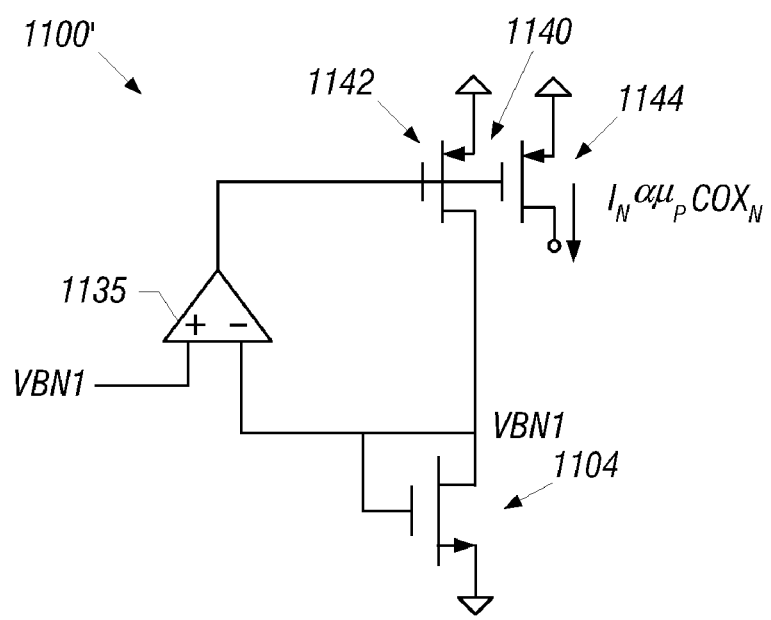
FIG. 10 is a schematic diagram of a tracking circuit in accordance with another embodiment of the present invention.

A different implementation is realized if the tracking device is biased in the saturation region. Referring now to FIG. 10, shown is a schematic diagram of a tracking circuit in accordance with another embodiment of the present invention. In the embodiment of FIG. 10, tracking circuit 1100' has a tracking device 1104 that is biased in the saturation region. As seen, this device is in turn coupled to a positive input terminal of an op amp 1135 and also to a first current mirror device 1142 of a current mirror 1140. As seen, the second current mirror device 1144 outputs an output current $I_N$. In the embodiment of FIG. 10, $I_N$ may equal:

$$I_N = \mu C_{OX} \frac{W}{2L}(V_{BN1} - V_{TN})^2 \quad [\text{EQ. 3}]$$

where if $V_{BN1}$ is chosen such that $I_N$ is relatively independent of $V_{TN}$ and $V_{BN1} \gg V_{TN}$ then $I_N$ depends on other process parameters such as $\mu C_{OX}$.

Figure 11:
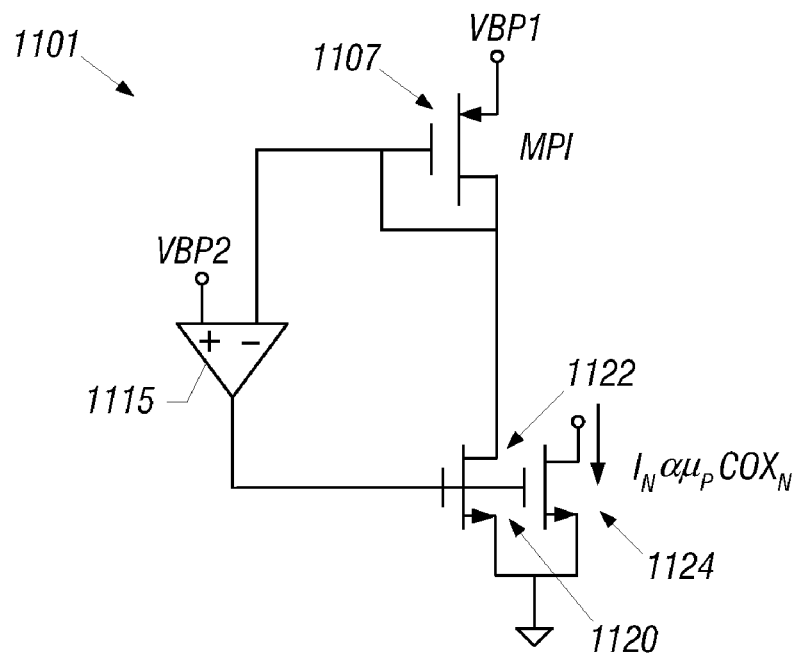
FIG. 11 is a schematic diagram of another tracking circuit in accordance with an embodiment of the present invention.

A similar circuit that generates the current for a PMOS-type tracking device is shown in FIG. 11. Referring now to FIG. 11, shown is a schematic diagram of another tracking circuit in accordance with an embodiment of the present invention. As shown in FIG. 11, circuit 1101' includes a PMOS tracking device 1107 biased in the saturation region and is in turn coupled to operational amplifier 1115 and a current mirror 1120 formed of current mirror devices 1122 and 1124. In the implementation of FIG. 11, the output current $I_P$ from second current mirror device 1124 may be in accordance with the following:

$$IP = \mu C_{OX} \frac{W}{2L}(V_{BP1} - V_{BP2} - |V_{TP}|)^2 \quad [\text{EQ. 4}]$$

Figure 12:
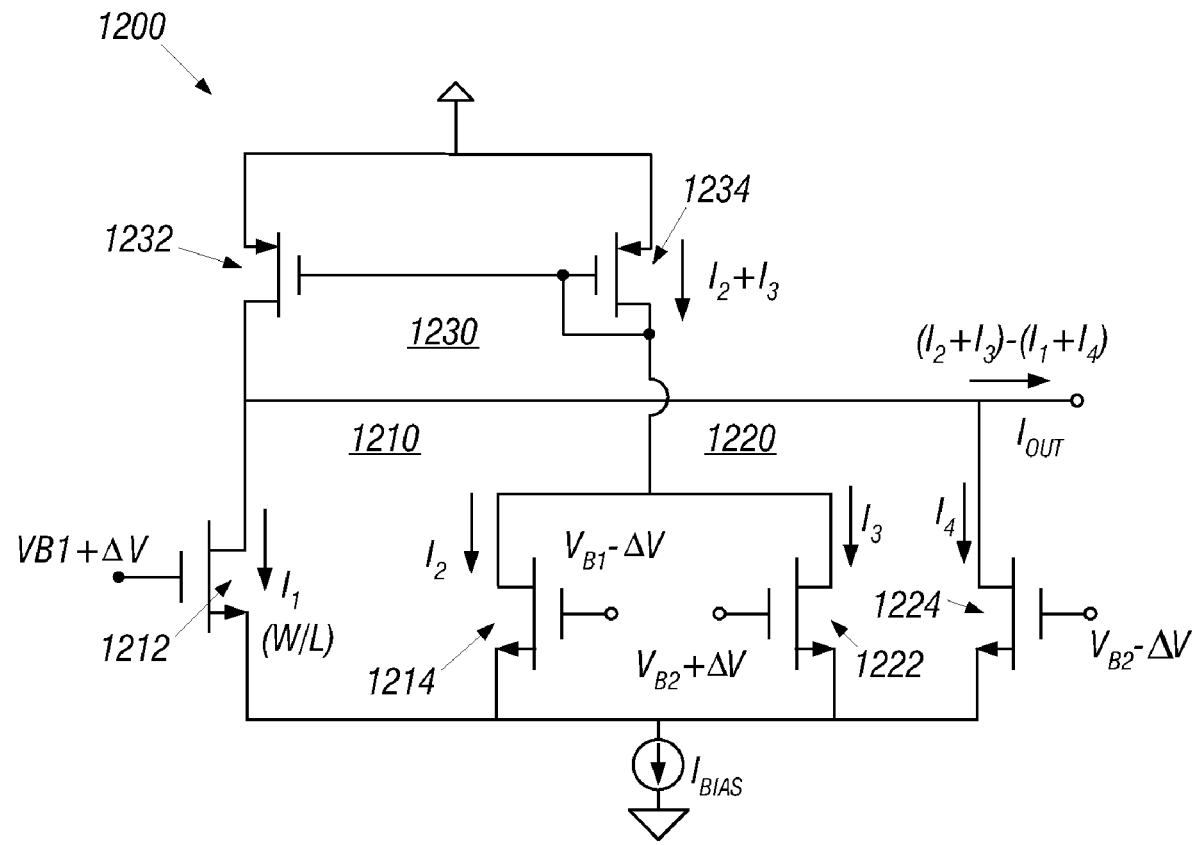
FIG. 12 is a schematic diagram of yet another process tracking circuit in accordance with one embodiment of the present invention.

Other implementations may provide other ways of generating a current proportional to mobility and oxide capacitance by using differential pair devices. Referring now to FIG. 12, shown is a schematic diagram of another process tracking circuit 1200 that can generate a current proportional to mobility and oxide capacitance. As seen in FIG. 12, circuit 1200 includes two differential pairs 1210 and 1220 formed of NMOS devices 1212 and 1214, and 1222 and 1224, respectively. As seen, each differential pair has commonly coupled source terminals coupled in turn to a current source $I_{BIAS}$. Devices 1212 and 1214 are biased at their gate terminals by bias voltages $V_{B1}+\Delta V$ and $V_{B1}-\Delta V$, respectively. In turn, devices 1222 and 1224 are biased at their gate terminals by bias voltages $V_{B2}+\Delta V$ and $V_{B2}-\Delta V$, respectively.

As further shown in FIG. 12, the drain terminals of devices 1212 and 1224 provide an output current, $I_{out}$, while the drain terminals of devices 1214 and 1222 are coupled to a current mirror 1230 formed of PMOS devices 1232 and 1234, and where the current mirror provides a current $I_2+I_3$.

In one embodiment, NMOS devices 1212, 1214, 1222 and 1224 are the same size. Assuming square law devices, $I_{OUT} = (I_2+I_3)-(I_1+I_4)=2 \mu C_{OX} W/L \Delta V (V_{B2}-V_{B1})$. Note that a complementary circuit can be implemented to obtain a current $I_P$ that is proportional to $\mu P C_{OXP}$.

Figure 13:
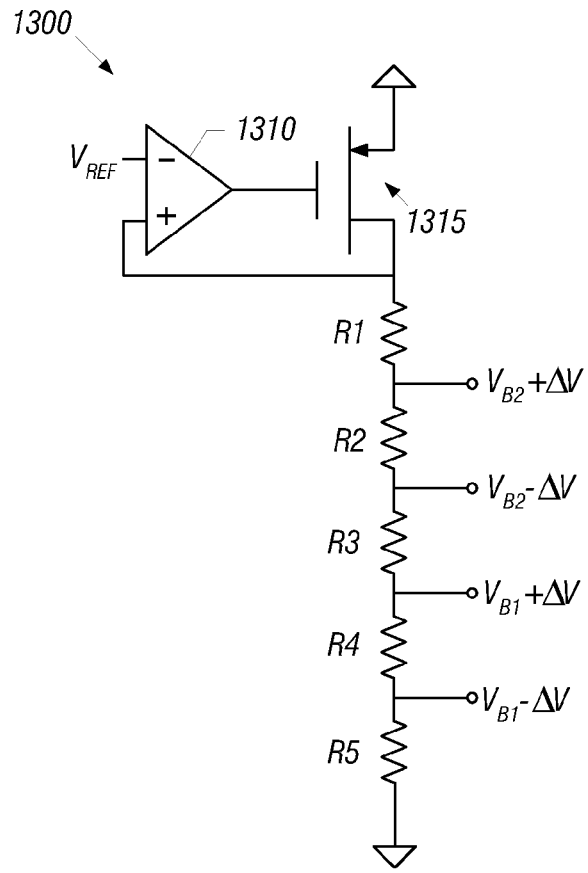
FIG. 13 is a schematic diagram of a bias generation circuit in accordance with an embodiment of the present invention.

While the various bias voltages for the embodiment of FIG. 12 can be generated in different manners, referring now to FIG. 13, shown is a schematic diagram of a bias generation circuit in accordance with an embodiment of the present invention. As shown in FIG. 13, bias generator 1300 includes an op-amp 1310 coupled to receive a reference voltage $V_{REF}$ at a negative input terminal, and having a positive input terminal coupled in feedback to a PMOS device 1315, that is gated by the op-amp output. In one embodiment, $V_{REF}$ may be derived from a bandgap voltage. As seen, a resistor string formed of a plurality of resistors R1-R5 is coupled to the drain terminal of device 1315 to provide the various bias voltages used, e.g., in the process tracking circuit of FIG. 12. Of course other manners of generating bias voltages can be realized.

Figure 14:
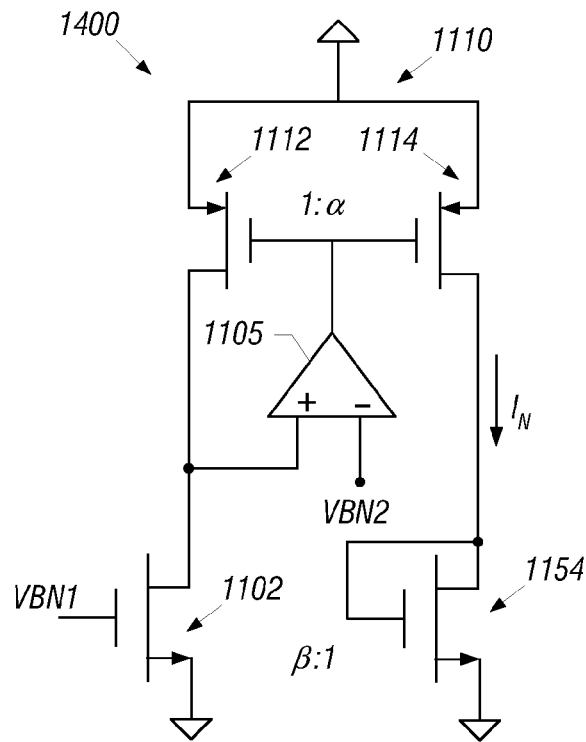
FIG. 14 is a schematic diagram of a circuit that includes the same process tracking circuit of FIG. 8.

Using the generated current that is obtained from a process tracking circuit (and which is proportional to $\mu C_{OX}$), a threshold voltage $V_T$ can be generated for the main device. More specifically, a MOS device can be coupled to the output of the current mirror of the process tracking circuit and which may be biased in a moderate inversion region to thus take the current output from the process tracking circuit and generate a threshold voltage. Thus FIG. 14 shows a circuit 1400 that generally includes the same process tracking circuit 1100 of FIG. 8, and adds an additional MOS device 1154, which may be configured as a diode-connected transistor, and having a size relationship with tracking device 1102 according to 1:β. This scaling factor may thus relate the structures, which each may be formed of one or more unit structures having a common aspect ratio. Note that a complementary circuit can be implemented to generate threshold voltage $V_{TP}$ from the process tracking circuit of FIG. 9, as shown below with regard to FIG. 16.

Assuming the tracking device 1102 is biased in the triode region and is strongly inverted and the diode device 1154 is in moderate inversion and in saturation and using EKV models to describe the transistor characteristics in a closed form mathematical expression:

$$I_N = \alpha\beta\mu_N C_{OXN} \frac{W}{L}(V_{BN1} - V_T)V_{BN2} \quad [\text{EQ. 5}]$$

$$= \mu_N C_{OXN} \frac{W}{L} 2nU_T^2 \left(\ln^2\left(1 + e^{\frac{V_{GS}-V_T}{2nU_T}}\right)\right)$$

which results in $$V_{GS} = V_{TN} + 2nU_T \ln\left[e^{\sqrt{\frac{\alpha\beta(V_{BN1}-V_{TN})V_{BN2}}{2nU_T^2}}} - 1\right] \quad [\text{EQ. 6}]$$

where α, β are current mirror ratios, as shown in FIG. 14; $V_{TN}$ is the threshold voltage of NMOS device 1154, $U_T$ equals $$\frac{KT}{q}$$

where K is the Boltzmann constant, T is absolute temperature (in Kelvin) and q is the charge of electrons; $V_{BN1}$ and $V_{BN2}$ are bias voltages that are fairly stable and independent of process and temperature (e.g., derived from a bandgap voltage); n is slope factor from EKV models and is process dependent; and W/L is the aspect ratio for the tracking and diode-connected devices. Note that the simple EKV model (without second order effects) to model $I_D$ versus $V_{GS}$ is as follows:

$$I_{DS} = \frac{W}{L}\mu C_{OX} 2nU_T^2 \left[ \begin{array}{c} \ln^2\left(1 + e^{\left(\frac{V_{GB}-V_T-nV_{SB}}{2nU_T}\right)}\right) - \\ \ln^2\left(1 + e^{\left(\frac{V_{GB}-V_T-nV_{DB}}{2nU_T}\right)}\right) \end{array} \right]$$ [EQ. 7]

The second term in the brackets of Equation 7 has been dropped because it is much smaller than the first term for a device biased in saturation. Note that from Equation 6 α and β can be chosen such that $V_{GS}=V_{TN}$. To achieve the above expression:

$$\alpha\beta \approx \frac{nU_T^2}{(V_{BN1} - V_{TN})(V_{BN2})}$$ [EQ. 8]

Note that Equation 5 does not include certain second order effects for simplicity. The basic concept works well even with second order effects such as short channel effects.

Embodiments for generating the threshold voltage may be performed at very low power as the diode device is biased in moderate inversion, which requires a very small current to keep the device biased at $V_T$. Embodiments thus track process and temperature very well and can therefore be used in biasing non-linear capacitance compensation circuitry such as shown in FIG. 1. In addition the circuit may be fairly insensitive to errors in bias voltages and current mirroring as the device is biased in moderate inversion (which has less dependence or sensitivity to the bias current) and can ideally be biased at the threshold voltage. The errors in the $V_T$ generation circuit can be given by the following expression:

$$V_{GS} = V_T + \epsilon,$$ [EQ. 9]

where $$\epsilon = 1.39 U_T \left[ \begin{array}{c} \frac{\Delta V_{BN1}}{V_{BN1}-V_T} + \frac{\Delta V_{BN2}}{V_{BN2}} - \\ \frac{\Delta V_T}{V_{BN1}-V_T} - \frac{\Delta n}{n} - \frac{2\Delta T}{T} \end{array} \right]$$

The fact that $U_T$ is much smaller compared to $V_T$ means that the error term $\epsilon$ is much smaller than $V_T$, and T is temperature.

Figure 15A:
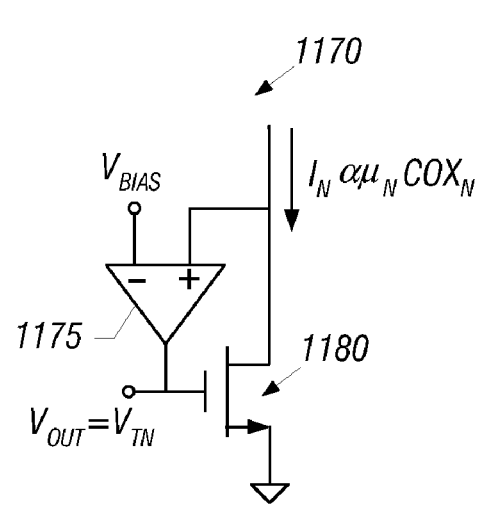
FIGS. 15A and 15B are schematic diagrams of voltage generation circuits that may be used to generate a threshold voltage in accordance with an embodiment of the present invention.

Note that although in the embodiment of FIG. 14, the output device is shown to be diode, other embodiments may take forms with (and without using) an amplifier and stacking devices. Referring now to FIG. 15A, shown is a block diagram of another voltage generation circuit that may be used to generate a threshold voltage in accordance with an embodiment of the present invention. As shown in FIG. 15A, voltage generation circuit 1170 includes an amplifier 1175 having a positive input terminal coupled to receive the output current from a tracking circuit (e.g., the tracking circuit of FIG. 8), and a NMOS device 1180 having a drain terminal coupled to the positive input terminal of amplifier 1175 and a gate terminal coupled to the output of amplifier 1175 and which further is configured as an output node to provide the threshold voltage $V_{TN}$. As further seen, amplifier 1175 further is coupled to receive a bias voltage $V_{BIAS}$ at its negative input terminal.

Figure 15B:
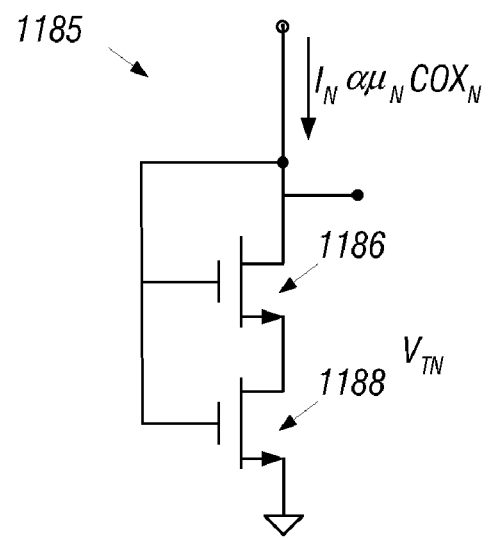

In another implementation as shown in FIG. 15B, a voltage generation circuit 1185 may include stacked MOSFETs 1186 and 1188 having commonly coupled gate terminals and where the top NMOS 1186 has a drain terminal that acts as an output node to provide the threshold voltage $V_{TN}$. Note that in some implementations additional devices can be stacked to minimize power dissipation and improve variations with mismatch.

Figure 16:
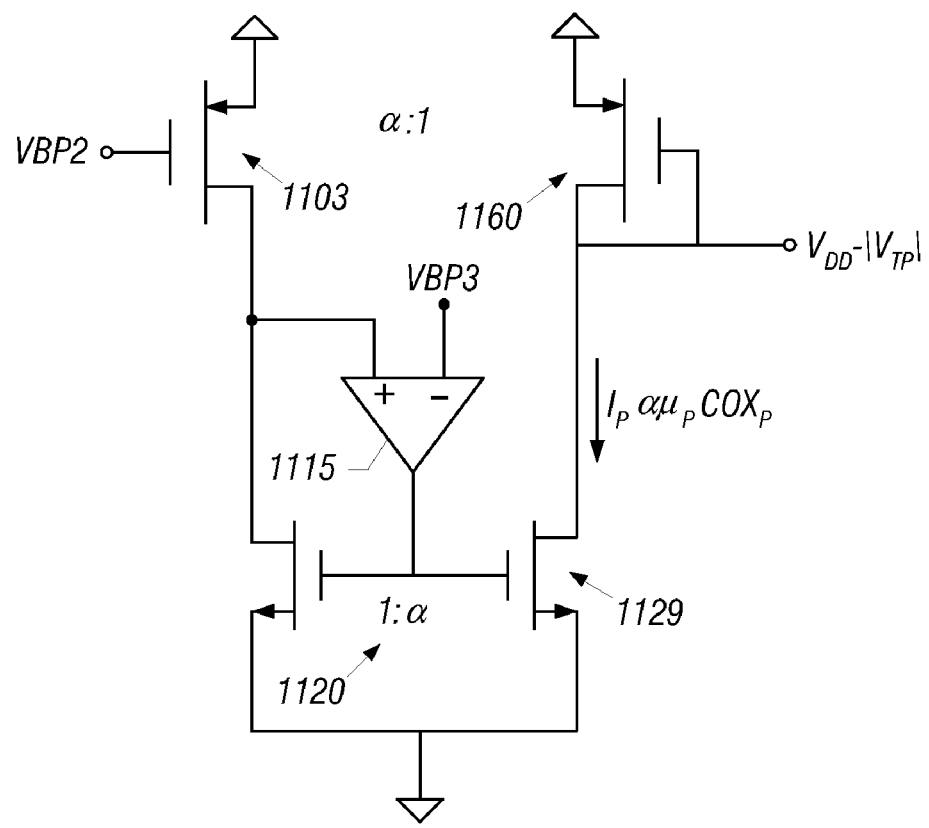
FIG. 16 is a schematic diagram of the tracking circuit of FIG. 9.

Referring now to FIG. 16, shown is a schematic diagram of the tracking circuit of FIG. 9 (i.e., with a PMOS tracking device) and further including a diode-connected device 1160 that provides an output voltage of $V_{DD}-|V_{TP}|$. The equations describing the operation are similar to Equations 5 to 8 above. Note that in FIGS. 14 and 16, the circuit can be calibrated or adjusted by making the sizes of the current mirrors, sizes of tracking devices, various output devices and/or bias voltages $V_{BN1}$, $V_{BP1}$, $V_{BP2}$, and $V_{BN2}$, programmable. In addition, constant programmable offsets can be introduced in addition to $V_{TN}$ and/or $|V_{TP}|$ for finer adjustment.

In embodiments in which threshold voltages are generated for a compensation circuit as described above regarding FIG. 1, the actual bias voltage to be provided to the compensation circuit may be the sum of the threshold voltages for the compensation device and main device. Accordingly, in different implementations $V_{TN}$ and $V_{TP}$ generation circuits can be combined in several ways, such as by using currents into diodes to sum voltages or by using operational amplifiers. In some implementations a circuit can be used to generate $V_{TN}$ $V_{TP}$ by summing currents into appropriate diodes. The circuit design (i.e., process tracking, voltage generation, and voltage combining circuits) can be distributed within a chip to bias various gain stages to minimize global and local variations. In a differential implementation, this same circuit can output a bias to both halves of the gain circuit (coupled to receive a differential input voltage). In this way, the total small signal capacitance may be kept fairly constant across temperature when used in conjunction with non-linear capacitance compensation tuning of a PA across temperature, easing circuitry.

Figure 17A:
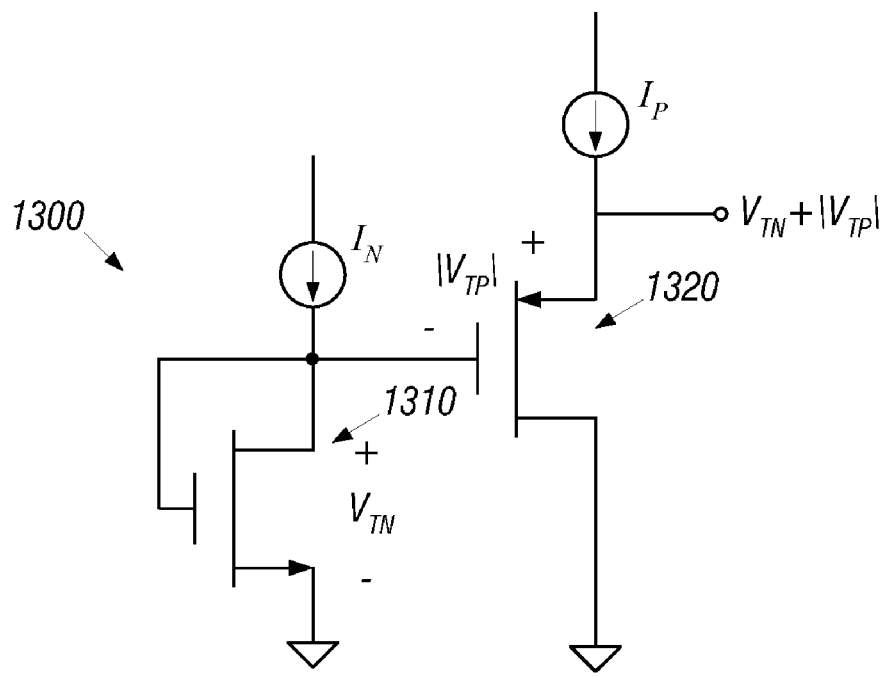
FIG. 17A is a schematic diagram of a circuit to combine threshold voltages of different polarities in accordance with one embodiment of the present invention.
Figure 17B:
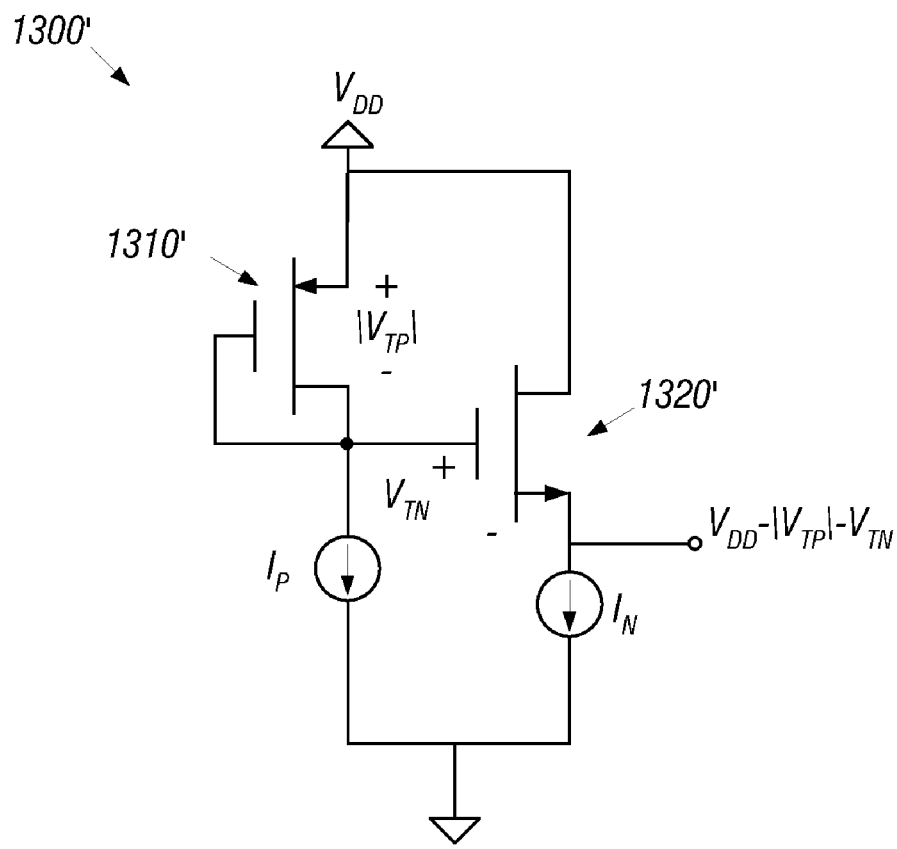
FIG. 17B is a schematic diagram of a voltage combining circuit that in accordance with another embodiment of the present invention.

Referring now to FIG. 17A, shown is a schematic diagram of a circuit to combine threshold voltages of different polarities. As seen in FIG. 17A, circuit 1300 includes a NMOS device 1310 and a PMOS device 1320. As seen, NMOS device 1310 may be coupled in a diode configuration with commonly coupled gate and drain terminals that further couple to a current source $I_N$, which may be the current generated by tracking circuit of, e.g., FIG. 8. As seen, this common node is further coupled to a gate terminal of PMOS device 1320, which in turn has a source terminal coupled to current source $I_P$, which may be the output current generated by the tracking circuit of FIG. 9, for example. Thus this source terminal may further act as an output node that provides the combined threshold voltages $V_{TN}+|V_{TP}|$. Referring now to FIG. 17B, shown is a similar voltage combining circuit 1300' that generates a voltage of $V_{DD}-V_{TN}-|V_{TP}|$ using PMOS device 1310' and NMOS device 1320'.

Figure 18A:
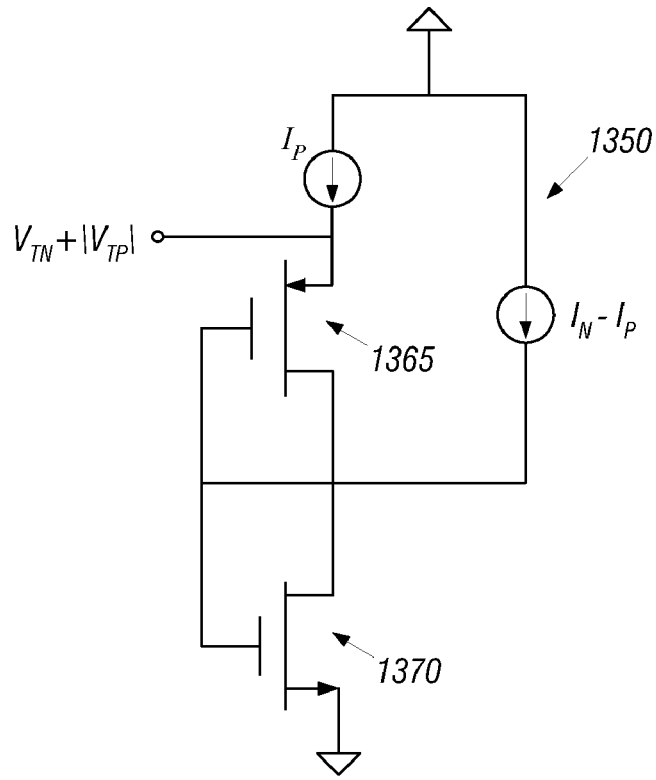
FIG. 18A is a schematic diagram of another voltage combining circuit in accordance with one embodiment of the present invention.
Figure 18B:
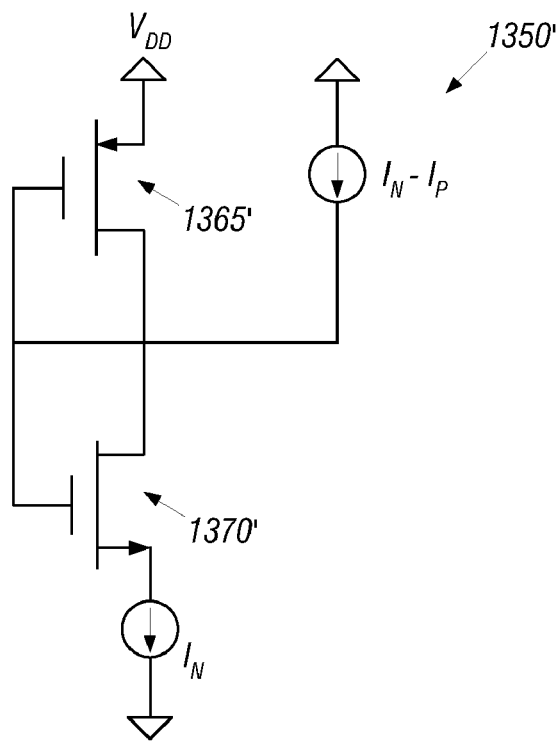
FIG. 18B is a schematic diagram of yet another voltage combining circuit in accordance with one embodiment of the present invention.

Yet another way of summing $V_{TN}+V_{TP}$ is shown in FIG. 18A, in which circuit 1350 includes a PMOS device 1365 stacked on a NMOS device 1370. Current sources, which may be provided from the different tracking circuits as discussed above, may be coupled to these devices to thus provide the combined threshold voltage output at an output node coupled to the source terminal of PMOS device 1365. Note that it is assumed that $I_N$ is greater than $I_P$. Referring now to FIG. 18B, shown is a similar voltage combining circuit 1350' that generates $V_{DD}-V_{TN}-|V_{TP}|$ using NMOS device 1370' and PMOS device 1365' at a node coupled to the source terminal of NMOS device 1370'. Yet another way of generating $V_{TN}+V_{TP}$ is to use operational amplifiers for summing the individual voltages.

Figure 19:
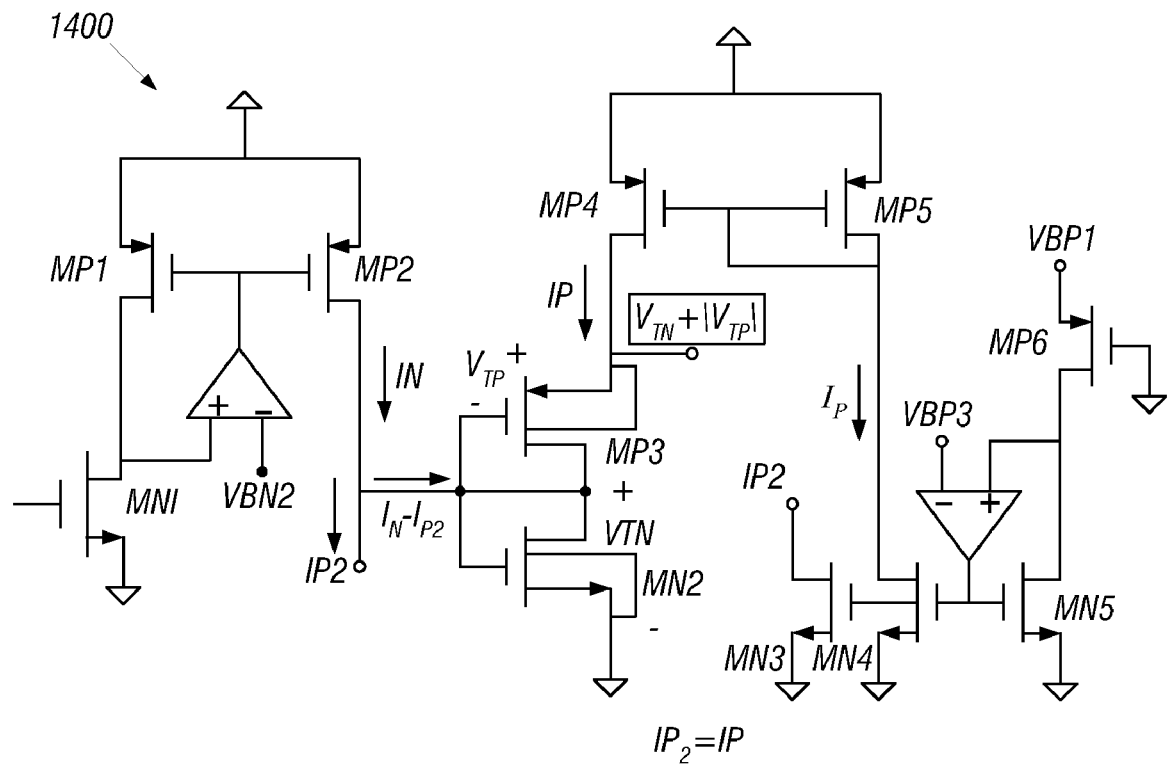
FIGS. 19 and 20 are example implementations of combined circuits for generating threshold voltages in accordance with one embodiment of the present invention.
Figure 20:
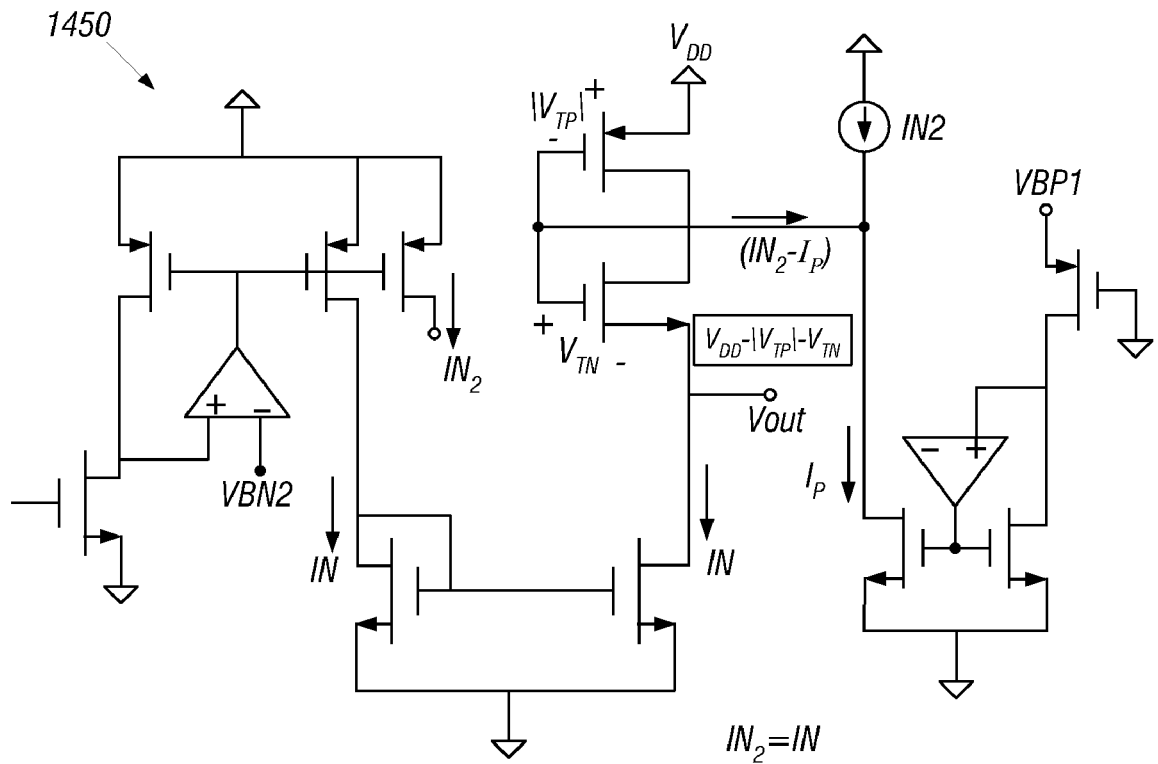

Referring now to FIGS. 19 and 20, shown are example implementations of combined circuits for generating threshold voltages for both a NMOS device and a PMOS device. Specifically, FIG. 19 shows an implementation of a circuit 1400 for generating a bias voltage (e.g., to be used by a compensation circuit of FIG. 1) to thus combine a voltage of $V_{TN}+|V_{TP}|$ at an output node, $V_{OUT}$. Specifically, FIG. 20 shows an implementation of a circuit 1450 for generating a bias voltage (e.g., to be used by a complementary compensation circuit (e.g., PMOS main device and NMOS compensation device component to that of FIG. 1) to thus combine a voltage of $V_{DD}-V_{TN}-|V_{TP}|$ at an output node, $V_{OUT}$.

As described above, a one-time programmable option for the bias voltage generated using an embodiment of the present invention can be included for optimizing the nonlinearity and distortion performance of a PA. There are a couple of options as to how to go about accomplishing the programmability with the circuits described above for $V_{TN}+V_{TP}$ generation. Adjusting the $I_N$ and $I_P$ currents which are proportional to $\mu_n C_{OX}$ and $\mu_p C_{OX}$ may be one such technique. This can be accomplished in one of many ways, such as by adjusting the current mirror ratios of the $\mu C_{OX}$ process tracking circuit with a DAC, adjusting the bias voltages with a DAC, adjusting the device sizes for the diode device and the device biased in moderate inversion, and/or providing an adjustment by adding/subtracting an offset from the $V_T$ generator.

Figure 21:
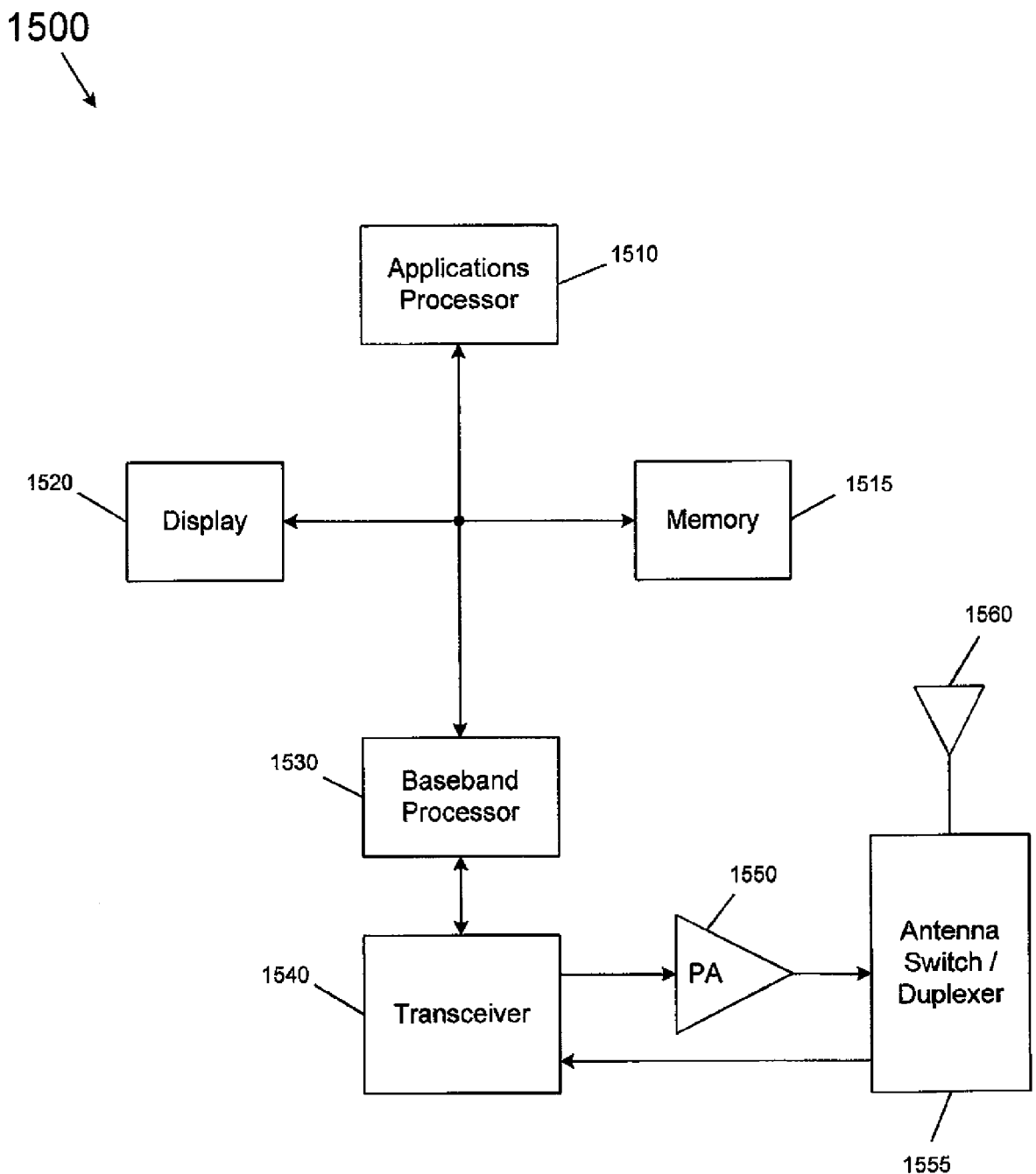
FIG. 21 is a block diagram of a wireless device in accordance with an embodiment of the present invention.

As described above, compensation circuitry in accordance with an embodiment of the present invention can be implemented in a PA such as a CMOS PA. Such a device can be used in various wireless systems, including handsets, mobile devices, PDAs and so forth. Referring now to FIG. 21, shown is a block diagram of a wireless device 1500 in accordance with an embodiment of the present invention, and which may be a 3G or 4G smart phone, for example. As shown in FIG. 21, wireless device 1500 may include an applications processor 1500 which may be a microprocessor or other programmable logic to handle various system features, such as running application programs desired by a user. To perform its functions, applications processor 1510 may communicate with a memory 1515, which may be a flash memory or other non-volatile memory. Applications processor 1510 may further communicate with a display 1520, such as an LCD display of the system. For handling RF communications, e.g., wireless phone calls, wireless data transmissions and so forth, e.g., according to a W-CDMA, OFDMA, or other protocol, applications processor 1510 may communicate with a baseband processor 1530, which may handle baseband operations both for transmit and receive paths. In turn, baseband processor 1530 is coupled to a transceiver, which may receive incoming baseband signals from baseband processor 1530, and perform processing to upconvert the signals to RF levels for transmission to a PA 1550. PA 1550 may be a power amplifier in accordance with an embodiment of the present invention that includes one or more gain stages having capacitor compensation and bias generation circuitry as described above. In turn, PA 1550 may be coupled to an antenna switch, duplexer or both 1555 which in turn is coupled to an antenna 1560, which radiates the amplified RF signal.

In a receive path, antenna 1560 couples through antenna switch 1555 and possibly through the duplexer or SAW filters and then to transceiver 1540, which may demodulate the incoming RF signals back to baseband for transmission to baseband processor 1530 for further processing. While shown with this particular implementation in the embodiment of FIG. 21, the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
    a tracking device biased by a first bias voltage;
    a comparator having a first input coupled to a first terminal of the tracking device to receive a first voltage and a second input to receive a second bias voltage; and
    a current minor coupled to the tracking device and gated by the comparator output to output a current, the current proportional to a mobility and oxide thickness of the tracking device and independent of a threshold voltage of the tracking device.

2. The apparatus of claim 1 wherein the tracking device is biased in a triode region.

3. The apparatus of claim 2, wherein the first bias voltage comprises a gate-to-source voltage of the tracking device and the second bias voltage comprises a drain-to-source voltage of the tracking device.

4. The apparatus of claim 1, wherein the tracking device is of a first polarity and first and second mirror devices of the current mirror are of a second polarity.

5. The apparatus of claim 4, wherein a device size of the first and second minor devices is programmable.

6. The apparatus of claim 5, further comprising a voltage generation circuit coupled to the current minor to receive the current and to generate a first voltage that tracks a threshold voltage of a gain stage device coupled to the voltage generation circuit across process and temperature.

7. The apparatus of claim 6, wherein the voltage generation circuit includes a diode-connected device biased in moderate inversion.

8. The apparatus of claim 6, wherein the voltage generation circuit includes a plurality of stacked devices coupled to the current minor, and having commonly coupled gate terminals, wherein a first terminal of one of the stacked devices is coupled to an output node to provide the first threshold voltage.

9. The apparatus of claim 6, further comprising a second voltage generation circuit coupled to a second process tracking circuit to receive a second current and to generate a second voltage that tracks a threshold voltage of a compensation device coupled to the gain stage device access process and temperature.

10. The apparatus of claim 9, further comprising a voltage combiner to combine the first voltage and an absolute value of the second voltage and to provide the combined voltage to bias the compensation device, wherein the compensation device is coupled to the gain stage device to compensate for a capacitance non-linearity of the gain stage device.

11. The apparatus of claim 6, wherein the tracking device is formed of at least one unit device having a first aspect ratio, and the gain stage device is formed of a plurality of unit devices having the first aspect ratio.

12. A method comprising:
    generating a current that is proportional to a mobility and an oxide capacitance of a tracking device, the current independent of a variation of a threshold voltage of the tracking device; generating a first voltage from the current in a voltage generation circuit; and
    providing the first voltage as at least a portion of a bias voltage for a device of a circuit.

13. The method of claim 12, wherein the circuit is a compensation circuit coupled to a main device to compensate for capacitance non-linearity of the main device, the device of the compensation circuit having an opposite polarity to the main device, wherein the first voltage corresponds to a threshold voltage of the main device.

14. The method of claim 12, further comprising generating a second current that is proportional to a mobility and an oxide capacitance of a second tracking device, the second current independent of a variation of a threshold voltage of the second tracking device, generating a second voltage from the second current in a second voltage generation circuit, and combining the second voltage with the first voltage to form the bias voltage for the device.

15. The method of claim 12, further comprising generating the current in a current mirror having a controllable ratio.

16. The method of claim 12, further comprising generating the current in a current generator having a first differential pair and a second differential pair with commonly coupled second terminals, wherein a first terminal of one of each of the first and second differential pairs is to generate the current at an output node, and further comprising a current minor having a first current minor device coupled to the output node and a second current mirror device coupled to first terminals of the other of each of the first and second differential pairs.

* * * * *

UNITED STATES PATENT AND TRADEMARK OFFICE
CERTIFICATE OF CORRECTION

PATENT NO. : 8,219,049 B2  
APPLICATION NO. : 12/578838  
DATED : July 10, 2012  
INVENTOR(S) : Anil Samavedam et al.

Page 1 of 1

It is certified that error appears in the above-identified patent and that said Letters Patent is hereby corrected as shown below:

Column 18:  
Line 11, "minor" should be --mirror--

Column 18:  
Line 26, "minor" should be --mirror--

Column 18:  
Line 28, "minor" should be --mirror--

Column 18:  
Line 37, "minor" should be --mirror--

Column 20:  
Line 6, "minor" should be --mirror--

Column 20:  
Line 7, "minor" should be --mirror--

Signed and Sealed this  
Eleventh Day of September, 2012

David J. Kappos  
*Director of the United States Patent and Trademark Office*